US011237481B2

(12) United States Patent
Oka et al.

(10) Patent No.: US 11,237,481 B2
(45) Date of Patent: Feb. 1, 2022

(54) METAL PLATE FOR MANUFACTURING DEPOSITION MASK AND MANUFACTURING METHOD FOR METAL PLATE, AND DEPOSITION MASK AND MANUFACTURING METHOD FOR DEPOSITION MASK

(71) Applicant: Dai Nippon Printing Co., Ltd., Tokyo (JP)

(72) Inventors: Hiroki Oka, Tokyo (JP); Sachiyo Matsuura, Tokyo (JP); Chiaki Hatsuta, Tokyo (JP); Chikao Ikenaga, Tokyo (JP); Hideyuki Okamoto, Tokyo (JP); Masato Ushikusa, Tokyo (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 0 days.

(21) Appl. No.: 16/578,291

(22) Filed: Sep. 21, 2019

(65) Prior Publication Data

US 2020/0017950 A1 Jan. 16, 2020

Related U.S. Application Data

(63) Continuation of application No. PCT/JP2018/041915, filed on Nov. 13, 2018.

(30) Foreign Application Priority Data

| Nov. 14, 2017 | (JP) | JP2017-219369 |
| Dec. 26, 2017 | (JP) | JP2017-249744 |
| Jan. 11, 2018 | (JP) | JP2018-002932 |

(51) Int. Cl.
*C23C 14/04* (2006.01)
*G03F 7/00* (2006.01)
(Continued)

(52) U.S. Cl.
CPC .............. *G03F 7/0035* (2013.01); *B21B 1/22* (2013.01); *C23C 14/042* (2013.01); *C23C 14/24* (2013.01);
(Continued)

(58) Field of Classification Search
CPC .......................... H01L 51/0011; G03F 7/0035
See application file for complete search history.

(56) References Cited

U.S. PATENT DOCUMENTS

| 2002/0017395 A1 | 2/2002 | Hirose et al. |
| 2009/0084683 A1 | 4/2009 | Campestrini et al. |

(Continued)

FOREIGN PATENT DOCUMENTS

| CN | 102692184 B | 7/2014 |
| CN | 105004786 A | 10/2015 |

(Continued)

OTHER PUBLICATIONS

U.S. Appl. No. 16/580,401, filed Sep. 24, 2019, Chikao Ikenaga.
(Continued)

*Primary Examiner* — Christopher S Kessler
(74) *Attorney, Agent, or Firm* — Burr & Brown, PLLC

(57) ABSTRACT

The metal plate includes a plurality of pits located on the surface of the metal plate. The manufacturing method for a metal plate for use in manufacturing of a deposition mask includes an inspection step of determining a quality of the metal plate based on a sum of volumes of a plurality of pits located at a portion of the surface of the metal plate.

5 Claims, 21 Drawing Sheets

(51) Int. Cl.
*G03F 7/20* (2006.01)
*B21B 1/22* (2006.01)
*C23C 14/24* (2006.01)
*C25D 1/04* (2006.01)
*C25D 3/56* (2006.01)
*H01L 51/56* (2006.01)
*H01L 27/32* (2006.01)
*H01L 51/00* (2006.01)
*H01L 51/50* (2006.01)

(52) U.S. Cl.
CPC ............... *C25D 1/04* (2013.01); *C25D 3/562* (2013.01); *G03F 7/0015* (2013.01); *G03F 7/0027* (2013.01); *G03F 7/2008* (2013.01); *G03F 7/2022* (2013.01); *H01L 51/56* (2013.01); *H01L 27/32* (2013.01); *H01L 51/0011* (2013.01); *H01L 51/5012* (2013.01)

(56) References Cited

U.S. PATENT DOCUMENTS

| | | |
|---|---|---|
| 2017/0141315 A1 | 5/2017 | Ikenaga |
| 2017/0198383 A1 | 7/2017 | Chang et al. |
| 2018/0023182 A1 | 1/2018 | Ikenaga et al. |
| 2018/0038002 A1 | 2/2018 | Tamura et al. |
| 2018/0065162 A1 | 3/2018 | Mikami et al. |
| 2018/0066352 A1 | 3/2018 | Tamura et al. |

FOREIGN PATENT DOCUMENTS

| | | |
|---|---|---|
| EP | 3 144 410 A1 | 3/2017 |
| EP | 3 257 964 A1 | 12/2017 |
| JP | S61-039344 A1 | 2/1986 |
| JP | S63-016525 A1 | 1/1988 |
| JP | H05-144384 A1 | 6/1993 |
| JP | H08-269742 A1 | 10/1996 |
| JP | H11-219986 A1 | 8/1999 |
| JP | 2002-012998 A1 | 1/2002 |
| JP | 2002-194573 A1 | 7/2002 |
| JP | 2004-183023 A1 | 7/2004 |
| JP | 2004-185890 A1 | 7/2004 |
| JP | 2008-293841 A1 | 12/2008 |
| JP | 2010-214447 A1 | 9/2010 |
| JP | 2010-247500 A1 | 11/2010 |
| JP | 5382259 B2 | 1/2014 |
| JP | 2014-148743 A1 | 8/2014 |
| JP | 2015-098650 A1 | 5/2015 |
| JP | 2015-129334 A1 | 7/2015 |
| JP | 2015-168847 A1 | 9/2015 |
| JP | 2015-168884 A1 | 9/2015 |
| JP | 2016-108643 A1 | 6/2016 |
| JP | 2016-121376 A1 | 7/2016 |
| JP | 2016-135505 A1 | 7/2016 |
| JP | 2017-064763 A1 | 4/2017 |
| JP | 2017-066530 A1 | 4/2017 |
| JP | 2017-088914 A1 | 5/2017 |
| JP | 2017-088915 A1 | 5/2017 |
| JP | 2017-101302 A1 | 6/2017 |
| JP | 2017-106114 A1 | 6/2017 |
| JP | 2017-125253 A1 | 7/2017 |
| JP | 2017-141500 A1 | 8/2017 |
| JP | 2018-040055 A1 | 3/2018 |
| WO | 2015/174269 A1 | 11/2015 |
| WO | 2016/129533 A1 | 8/2016 |
| WO | 2017/013904 A1 | 1/2017 |
| WO | 2017/014016 A1 | 1/2017 |
| WO | 2017/014172 A1 | 1/2017 |
| WO | 2018/043641 A1 | 3/2018 |
| WO | 2018/043642 A1 | 3/2018 |
| WO | 2018/235862 A1 | 12/2018 |

OTHER PUBLICATIONS

U.S. Appl. No. 16/580,524, filed Sep. 24, 2019, Chikao Ikenaga.
U.S. Appl. No. 16/680,942, filed Nov. 12, 2019, Hiroki Oka.
Extended European Search Report (Application No. 19208503.3) dated Feb. 11, 2020.
International Search Report and Written Opinion dated Feb. 5, 2019 from corresponding International Application No. PCT/JP2018/041915.
International Search Report and Written Opinion dated Feb. 12, 2019 from corresponding International Application No. PCT/JP2018/041918.
International Search Report and Written Opinion dated Feb. 12, 2019 from corresponding International Application No. PCT/JP2018/041919.
Japanese Office Action dated Feb. 1, 2019 from corresponding Japanese Application No. 2018-563643.
Japanese Office Action dated Mar. 29, 2019 from corresponding Japanese Application No. 2018-563643.
Japanese Patent Publication No. 2017-106114 Al (Ref. AI) and International Publication No. WO 2017/014016 A1 (Ref. AX) correspond to U.S. Appl. No. 2018/0065162 A1 (Ref. AA).
International Publication No. WO 2015/174269 A1 (Ref. AK) corresponds to U.S. Appl. No. 2017/0141315 A1 (Ref. AB).
Japanese Patent Publication No. 2017-066530 A1 (Ref. AM) and International Publication No. WO 2016/129533 A1 (Ref. AW) correspond to U.S. Appl. No. 2018/0023182 A1 (Ref. AC).
Japanese Patent Publication No. 2017-125253 A1 (Ref. AQ) corresponds to U.S. Appl. No. 2017/0198383 A1 (Ref. AD).
Japanese Patent Publication No. 2002-012998 A1 (Ref. BA) corresponds to U.S. Appl. No. 2002/0017395 A1 (Ref. AE).
International Publication No. WO 2017/013904 A1 (Ref. BF) corresponds to U.S. Appl. No. 2018/0066352 A1 (Ref. AF).
International Search Report and Written Opinion (Application No. PCT/JP2018/041915) dated Feb. 5, 2019.
International Search Report and Written Opinion (Application No. PCT/JP2018/041918) dated Feb. 12, 2019.
International Search Report and Written Opinion (Application No. PCT/JP2018/041919) dated Feb. 12, 2019.
Japanese Office Action (Application No. 2018-563643) dated Feb. 1, 2019 (with English translation).
Japanese Office Action (Application No. 2018-563643) dated Mar. 29, 2019 (with English translation).
Chinese Office Action (Application No. 201811344277.0) dated Jul. 16, 2020 (with English translation).
Japanese Office Action (Application No. 2019-122142) dated Aug. 28, 2020 (with English translation).
European Search Report (Application No. 18879719.5) dated Oct. 1, 2021.
European Search Report (Application No. 18879902.7) dated Aug. 17, 2021.
U.S. Office Action (U.S. Appl. No. 16/680,942) dated Nov. 10, 2021.
Japanese Office Action (Application No. 2021-133631) dated Sep. 10, 2021 (with English translation).
E112-13, ASTM International, "*Standard Test Methods for Determining Average Grain Size*," (Feb. 2014).
Tanikawa, Keiichi, "*Surface Chemistry of Cold Rolling Oil*," vol. 10, Issue 7, pp. 448-455 (Mar. 13, 1989).

| | V2(0.2 μm) [μm³/mm²] | 3σ(D1) [μm] | 3σ(D2) [μm] | 3σ(ave) [μm] |
|---|---|---|---|---|
| 1ST SAMPLE | 12 | 0.567 | 0.376 | 0.472 |
| 2ND SAMPLE | 4189 | 0.674 | 0.737 | 0.706 |
| 3RD SAMPLE | 14020 | 1.004 | 0.745 | 0.874 |
| 4TH SAMPLE | 8118 | 1.093 | 0.865 | 0.979 |
| 5TH SAMPLE | 8664 | 0.753 | 0.908 | 0.831 |
| 6TH SAMPLE | 1014 | 0.459 | 0.506 | 0.483 |
| 7TH SAMPLE | 11466 | 0.768 | 0.917 | 0.842 |
| 8TH SAMPLE | 4126 | 0.568 | 0.593 | 0.580 |
| 9TH SAMPLE | 5235 | 0.598 | 0.592 | 0.595 |
| 10TH SAMPLE | 15424 | 1.334 | 1.098 | 1.155 |

FIG. 29

|  | V2(0.1 μm) [μm³/mm²] | V2(0.2 μm) [μm³/mm²] | V2(0.3 μm) [μm³/mm²] | V2(0.4 μm) [μm³/mm²] | V2(0.5 μm) [μm³/mm²] |
|---|---|---|---|---|---|
| 1ST SAMPLE | 700 | 12 | 0 | 0 | 0 |
| 2ND SAMPLE | 10919 | 4189 | 1836 | 785 | 314 |
| 3RD SAMPLE | 26555 | 14020 | 7422 | 3995 | 2158 |
| 4TH SAMPLE | 18536 | 8118 | 3357 | 1376 | 512 |
| 5TH SAMPLE | 151394 | 8624 | 3627 | 1558 | 868 |
| 6TH SAMPLE | 71169 | 996 | 115 | 26 | 10 |
| 7TH SAMPLE | 23950 | 11466 | 5308 | 2296 | 960 |
| 8TH SAMPLE | 12524 | 4412 | 1603 | 641 | 273 |
| 9TH SAMPLE | 15015 | 5235 | 1773 | 576 | 194 |
| 10TH SAMPLE | 33365 | 15424 | 5707 | 2064 | 922 |

METAL PLATE FOR MANUFACTURING DEPOSITION MASK AND MANUFACTURING METHOD FOR METAL PLATE, AND DEPOSITION MASK AND MANUFACTURING METHOD FOR DEPOSITION MASK

CROSS-REFERENCE TO RELATED APPLICATIONS

This application is a continuation application of International Application No. PCT/JP2018/41915, filed on Nov. 13, 2018, which claims the benefit of priority from Japanese Patent Application No. 2017-219369, filed on Nov. 14, 2017, Japanese Patent Application No. 2017-249744, filed on Dec. 26, 2017 and Japanese Patent Application No. 2018-2932, filed on Jan. 11, 2018. The entire contents of these applications are incorporated herein by reference.

BACKGROUND

Field

Embodiments of the present disclosure relate to a metal plate for manufacturing a deposition mask, and a manufacturing method for the metal plate. Embodiments of the present disclosure also relate to a deposition mask and a manufacturing method for the deposition mask.

Background Art

A display device used in a portable device such as a smart phone and a tablet PC is required to have high fineness, e.g., a pixel density of 500 ppi or more. In addition, there is increasing demand that the portable device be applicable in the Ultra High-Definitions (UHD) reference. In this case, the pixel density of the display device preferably is 800 ppi or more, for example.

Among display devices, an organic EL display device draws attention because of its excellent responsibility, low power consumption, and high contrast. A known method for forming pixels of an organic EL display device is a method which uses a deposition mask in which through-holes are formed and arranged in a desired pattern, and forms pixels in the desired pattern. To be specific, a deposition mask is firstly brought into tight contact with a substrate for organic EL display device, and then the substrate and the deposition mask in tight contact therewith are put into a deposition apparatus so as to carry out a deposition step for depositing an organic material on the substrate. This enables formation of pixels containing the organic material on the substrate in a pattern corresponding to that of through-holes in the deposition mask.

A known manufacturing method for deposition mask is a method in which through-holes are formed in a metal plate by etching using a photolithographic technique. For example, a first resist pattern is firstly formed on a first surface of the metal plate via exposure and development, and a second resist pattern is formed on a second surface of the metal plate via exposure and development. Then, an area of the first surface of the metal plate, which is not covered with the first resist pattern, is etched to form first recesses in the first surface of the metal plate. Thereafter, an area of the second surface of the metal plate, which is not covered with the second resist pattern, is etched to form second recesses in the second surface of the metal plate. At this time, by etching the areas such that each first recess and each second recess communicate with each other, through-holes passing through the metal plate can be formed. The metal plate for preparing the deposition mask is prepared by, for example, rolling a base material composed of an iron alloy containing nickel.

PRIOR ART

Patent Document

Patent Document 1: Japanese Patent No. 5382259

SUMMARY

An object of embodiments of the present disclosure is to provide a metal plate suitable for manufacturing a deposition mask.

According to a first aspect, there is provided a manufacturing method for a metal plate used for manufacturing a deposition mask, the metal plate including a plurality of pits located on the surface of the metal plate, and the manufacturing method comprising an inspection step of determining a quality of the metal plate based on a sum of volumes of a plurality of pits located at a portion of the surface.

According to a second aspect of the disclosure, in the manufacturing method for a metal plate according to the aforementioned first aspect, the inspection step may include a calculation step of calculating a corrected pit volume density by dividing the sum of the volumes of parts of the plurality of pits by an area of the portion of the surface, the parts being a correction distance or more away from the surface in the thickness direction of the metal plate; and a determination step where the metal plate is determined as good when the corrected pit volume density is equal to or less than a first threshold.

According to a third aspect of the disclosure, in the manufacturing method for a metal plate according to the aforementioned second aspect, the metal plate may be determined as good in the determination step when the corrected pit volume density is equal to or more than a second threshold and equal to or less than the first threshold.

According to a fourth aspect of the disclosure, in the manufacturing method for a metal plate according to the aforementioned first aspect, the inspection step may include a calculation step of calculating the corrected pit volume density by dividing a sum of volumes of parts of the plurality of pits located at a portion of the surface by the area of the portion of the surface, the parts being a correction distance or more away from the surface in the thickness direction of the metal plate; and a selection step where the metal plate having a corrected pit volume density of equal to or less than the first threshold is selected. According to a fifth aspect of the disclosure, in the manufacturing method for a metal plate according to the aforementioned fourth aspect, the metal plate having a corrected pit volume density of equal to or more than the second threshold and equal to or less than the first threshold may be selected in the selection step.

According to a sixth aspect of the disclosure, in the manufacturing method for a metal plate according to the aforementioned second to fifth aspects, the correction distance may be 0.2 μm.

According to a seventh aspect of the disclosure, in the manufacturing method for a metal plate according to the aforementioned second to sixth aspects, the first threshold may be 15,000 μm$^3$/mm$^2$. According to an eighth aspect of the disclosure, in the manufacturing method for a metal plate according to the aforementioned third to fifth aspects, the second threshold may be 10 $\mu m^3/mm^2$.

According to a ninth aspect of the disclosure, in the manufacturing method for a metal plate according to the aforementioned second to eighth aspects, the calculation step may include a measurement step of measuring a depth of the pit at each position in the portion of the surface.

According to a tenth aspect of the disclosure, in the manufacturing method for a metal plate according to the aforementioned ninth aspect, the depth of the pit may be measured by using a laser microscope in the measurement step.

According to a eleventh aspect of the disclosure, in the manufacturing method for a metal plate according to the aforementioned first to tenth aspects, an area of the portion of the surface may be 0.1 $mm^2$ or more.

According to a twelfth aspect, there is provided a metal plate for use in manufacturing of a deposition mask, the metal plate including a plurality of pits located on a surface of the metal plate; wherein, when a sum of volumes of parts of the plurality of pits located at a portion of the surface, which the parts of the plurality of pits are 0.2 $\mu m$ or more away from the surface in the thickness direction of the metal plate, is referred to as a corrected pit volume, the corrected pit volume density calculated by dividing the corrected pit volume by an area of the portion of the surface is 15,000 $\mu m^3/mm^2$ or less; wherein the corrected pit volume is calculated based on a result for a depth of the pit located at each position of the portion of the surface, the result being measured with a laser microscope; and wherein the area of the portion of the surface is 0.1 $mm^2$ or more.

According to a thirteenth aspect of the disclosure, in the metal plate according to the aforementioned twelfth aspect, the corrected pit volume density may be 10 $\mu m^3/mm^2$ or more.

According to a fourteenth aspect of the disclosure, in the metal plate according to the aforementioned twelfth or thirteenth aspect, the metal plate may be composed of an iron alloy containing nickel.

According to a fifteenth aspect, there is provided a manufacturing method for a deposition mask including a plurality of through-holes formed therein, the method including a step of preparing the metal plate manufactured by the manufacturing method according to the aforementioned first to eleventh aspects, or the metal plate according to the aforementioned twelfth to fourteenth aspects; and a processing step of etching the metal plate to form the through-hole in the metal plate.

According to a sixteenth aspect, there is provided a deposition mask, including a metal plate including a plurality of pits located on a surface; and a plurality of through-holes formed in the metal plate; wherein, when a sum of volumes of parts of a plurality of pits located at a portion of the surface, which the parts of the plurality of pits are 0.2 $\mu m$ or more away from the surface in the thickness direction of the metal plate, is referred to as the corrected pit volume, the corrected pit volume density calculated by dividing the corrected pit volume by the area of the portion of the surface is 15,000 $\mu m^3/mm^2$ or less; wherein the corrected pit volume is calculated based on a result for a depth of the pit at each position of the portion of the surface, the result being measured with a laser microscope; and wherein an area of the portion of the surface is 0.1 $mm^2$ or more.

According to a seventeenth aspect of the disclosure, in the deposition mask according to the aforementioned sixteenth aspect, the corrected pit volume density may be 10 $\mu m^3/mm^2$ or more.

According to one embodiment of the present disclosure, a metal plate suitable for manufacturing a deposition mask can be efficiently obtained.

BRIEF DESCRIPTION OF THE DRAWINGS

FIG. 29 is a table showing the inspection results for the state of pits in the surface of each sample according to the first inspection example.

DESCRIPTION OF EMBODIMENTS

Figure 1:
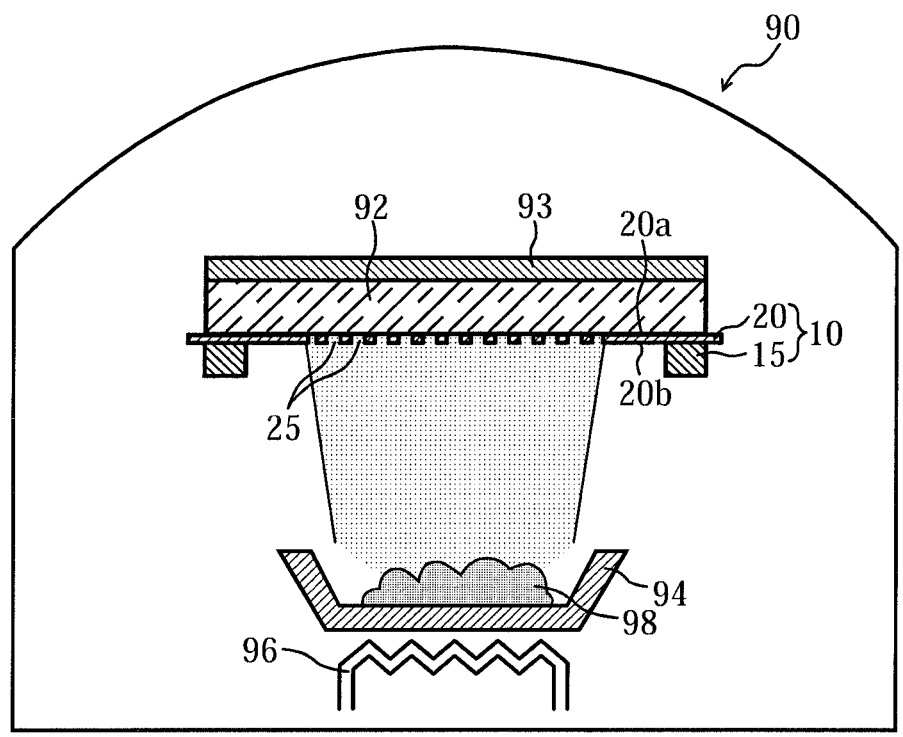
FIG. 1 is a view showing a deposition apparatus including a deposition mask apparatus according to one embodiment of the present disclosure.

An embodiment of the present disclosure will be described below with reference to the drawings. In the drawings attached to the specification, a scale size, an aspect ratio and so on are changed and exaggerated from the actual ones, for the convenience of easiness in illustration and understanding.

It is noted that an embodiment of the present disclosure can be combined with other embodiment or a modification within a range without any contradiction. The other embodiments, or the other embodiment and the modification can also be combined within a range without any contradiction. The modifications can also be combined within a range without any contradiction.

In embodiments of the present disclosure, where a plurality of steps are disclosed for a method such as manufacturing method, a non-disclosed other step may be conducted between the disclosed steps. The disclosed steps may be conducted in any order within a range without any contradiction.

A problem to be solved by embodiments of the present disclosure will be described.

A metal plate after being rolled may have pits such as oil pits formed on the surface. The state of the pit in the surface of the metal plate affects the size precision and the positional precision of through-holes formed in the metal plate. For example, when the depth of a pit in the surface of the metal plate is large, the size of a through-hole formed in the metal plate will be larger than a designed value. For this reason, a technique for inspecting the state of pits in the surface of a metal plate is important.

Known techniques for inspecting irregularities such as pit in the surface of a metal plate include a technique of determining the arithmetic average roughness (Ra) and the maximum height (Ry) of the surface. The arithmetic average roughness (Ra) refers to a value obtained by measuring the position of the surface of the metal plate in the thickness direction (hereinafter also referred to as "height position") at a plurality of points on a given straight line, and calculating the average thereof. The maximum height (Ry) refers to the difference between the maximum value and the minimum value of measurement results when the height position of the surface of the metal plate is measured at a plurality of points on a given straight line.

The present inventors have conducted extensive studies and found that there is not necessarily a high degree of correlation between indices of surface irregularities in the conventional art, such as arithmetic average roughness (Ra), and the size precision of through-holes formed in a metal plate. For this reason, when the quality of a metal plate is determined based on the arithmetic average roughness (Ra), it is necessary to make the threshold for pass/fail determination more severe than necessary in order to prevent an erroneous determination. This leads to reduction of the yield of the metal plate.

Embodiments of the present disclosure aim to provide a metal plate and a manufacturing method for the metal plate, and a deposition mask and a manufacturing method for the deposition mask, which can effectively solve such a problem.

FIG. 1 to FIG. 28 are views illustrating embodiments of the present disclosure. In the below embodiment and the modification, a manufacturing method for a deposition mask for use in patterning an organic material in a desired pattern on a substrate, when an organic EL display apparatus is manufacture, for example. However, not limited thereto, the embodiments of the present disclosure can be applied to a deposition mask for various uses.

In this specification, the terms "plate", "sheet", and "film" are not differentiated from one another based only on the difference of terms. For example, the term "plate" is a concept including members that may be called sheets or films.

In addition, the term "plate plane (sheet plane, film plane)" means a plane corresponding to a plane direction of a plate-like (sheet-like, film-like) member as a target, when the plate-like (sheet-like, film-like) member as a target is seen as a whole in general. A normal direction used to the plate-like (sheet-like, film-like) member means a normal direction with respect to a plate plane (sheet surface, film surface) of the member.

Further, in this specification, terms specifying shapes, geometric conditions, physical characteristics and their degrees, e.g., "parallel", "perpendicular", "same", "similar", etc., and values such as length, angle and physical characteristics are not limited to their strict definitions, but interpreted as including ranges that can be expected to give similar functions.

First, a deposition apparatus 90 that performs deposition process for depositing a deposition material to a target with reference to FIG. 1. As shown in FIG. 1, the deposition apparatus 90 may include a vapor deposition source (for example, a crucible 94), a heater 96, and a deposition mask apparatus 10 therein. The deposition apparatus 90 may further include a gas discharge means for making the inside of the deposition apparatus 90 into a vacuum atmosphere. The crucible 94 contains a deposition material 98 such as an organic luminescent material. The heater 96 heats the crucible 94 to evaporate the deposition material 98 under a vacuum atmosphere. The deposition mask apparatus 10 is arranged to face with the crucible 94.

The deposition mask apparatus 10 will be described below. As shown in FIG. 1, the deposition mask apparatus 10 may include a deposition mask 20 and a frame 15 that supports the deposition mask 20. The frame 15 is configured to support the deposition mask 20 in a state of being pulled in the surface direction in order to prevent the deposition mask 20 from warping. As shown in FIG. 1, the deposition mask apparatus 10 is arranged in the deposition apparatus 90 such that the deposition mask 20 faces a target substrate onto which the deposition material 98 is deposited, for example, an organic EL substrate 92. In the description below, the surface of the deposition mask 20 on the side of the organic EL substrate 92 is referred to as first surface 20a, while the surface positioned on the side opposite to the first surface 20a is referred to as second surface 20b.

As shown in FIG. 1, the deposition mask apparatus 10 may include a magnet 93 arranged on the surface of the organic EL substrate 92 on the side opposite to the deposition mask 20. When the magnet 93 is provided, the magnetic force attracts the deposition mask 20 toward the side of the magnet 93, so that the deposition mask 20 can be brought into tight contact with the organic EL substrate 92.

Figure 3:
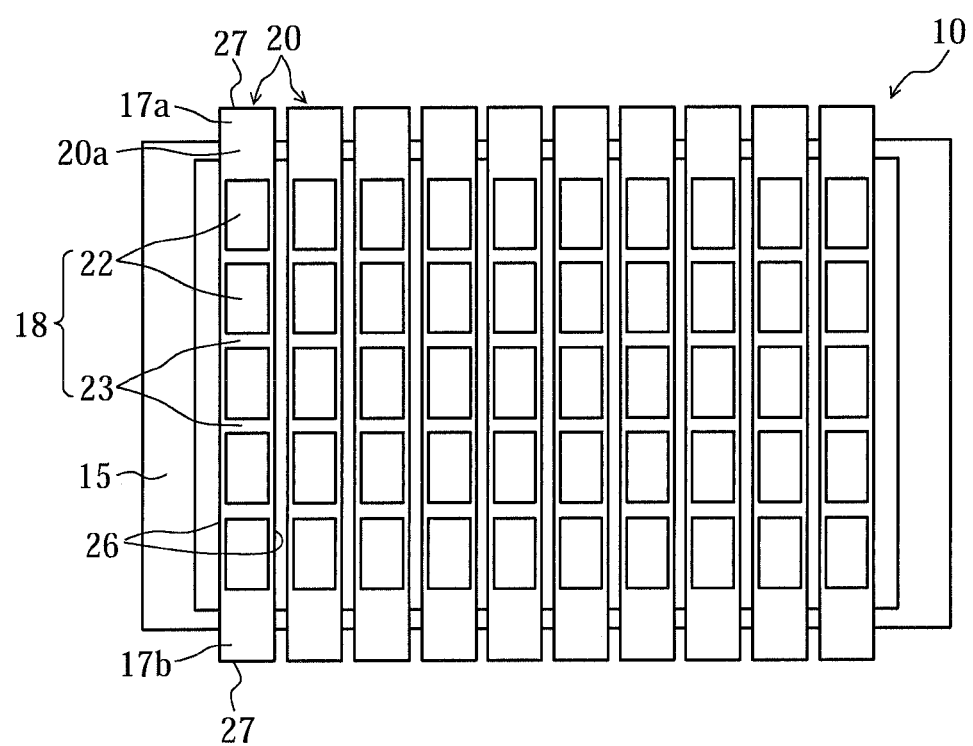
FIG. 3 is a plan view showing a deposition mask apparatus according to one embodiment of the present disclosure.

FIG. 3 is a plan view illustrating the deposition mask apparatus 10 viewed from the first surface 20a side of the deposition mask 20. As shown in FIG. 3, the deposition mask apparatus 10 may include a plurality of deposition masks 20. The deposition mask 20 each may have a pair of long sides 26 and a pair of short sides 27. For example, the deposition mask 20 each may have a rectangular shape. The deposition mask 20 each may be fixed to the frame 15 at or near the pair of short sides 27 by spot welding or the like.

The deposition mask 20 may include a metal plate substrate in which a plurality of through-holes 25 passing through the deposition mask 20 are formed. The deposition material 98 that has been evaporated from the crucible 94 and arrived at the deposition mask apparatus 10 adheres to the organic EL substrate 92 through the through-holes 25 in the deposition masks 20. As a result, a film of the deposition material 98 can be formed on the surface of the organic EL substrate 92 in a desired pattern corresponding to the positions of the through-holes 25 of the deposition masks 20.

Figure 2:
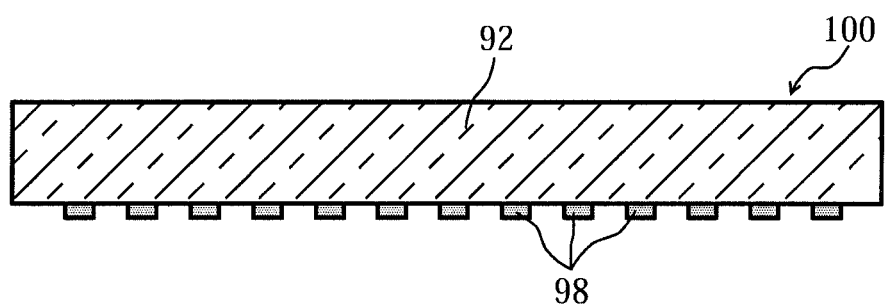
FIG. 2 is a sectional view showing an organic EL display device (an organic EL display device intermediate) manufactured using the deposition mask apparatus shown in FIG. 1.

FIG. 2 is a sectional view illustrating an organic EL display device 100 produced using the deposition apparatus 90 shown in FIG. 1. The organic EL display device 100 include at least the organic EL substrate 92 and a pixel containing the deposition material 98 provided in a certain pattern. The organic EL display device 100 further include an electrode electrically connected to the pixel containing the deposition material 98 (not shown). The electrode is, for example, pre-provided to the organic EL substrate 92 before adhesion of the deposition material 98 to the organic EL substrate 92 by the deposition step. The organic EL display device 100 further include other components, such as sealing member for sealing a space around the pixel containing the deposition material 98 from the outside. Thus, the organic EL display device 100 shown in FIG. 2 can be an intermediate of an organic EL display device, which is produced in an intermediate stage during manufacturing of the organic EL display device.

When a color display with a plurality of colors is desired, a deposition apparatus 90 on which the deposition mask 20 corresponding to each color is mounted is prepared, and the organic EL substrate 92 is sequentially put into each vapor deposition apparatus 90. This enables sequential vapor deposition of, for example, an organic luminescent material for red, an organic luminescent material for green and an organic luminescent material for blue to the organic EL substrate 92.

The deposition process may be performed inside the deposition apparatus 90 in a high-temperature atmosphere. In this case, during the deposition process, the deposition masks 20, the frame 15 and the organic EL substrate 92, which are held inside the deposition apparatus 90, are also heated. At this time, each of deposition mask 20, the frame 15 and the organic EL substrate 92 develop size change behaviors based on their respective thermal expansion coefficients. In this case, when the thermal expansion coefficients of the deposition mask 20, the frame 15 and the organic EL substrate 92 largely differ from one another, positioning displacement occurs because of the difference in size change. As a result, the size precision and the positional precision of the deposition material to be adhered to the organic EL substrate 92 is lower.

In order to avoid this problem, the thermal expansion coefficients of the deposition mask 20 and the frame 15 are preferably equivalent to the thermal expansion coefficient of the organic EL substrate 92. For example, when a glass substrate is used as the organic EL substrate 92, an iron alloy containing nickel can be used as a main material of the deposition mask 20 and the frame 15. For example, an iron alloy containing nickel in an amount of 30% by mass and 54% by mass or less can be used as a material of the substrate constituting the deposition masks 20. Specific examples of the iron alloy containing nickel include an invar material containing nickel in an amount of 34% by mass or more and 38% by mass or less, a super invar material containing nickel in an amount of 30% by mass or more and 34% by mass or less and further containing cobalt, and a low thermal expansion Fe—Ni based plated alloy containing nickel in an amount of 38% by mass or more and 54% by mass or less.

In the case where the temperatures of the deposition mask 20, the frame 15 and the organic EL substrate 92 do not reach a high temperature during the deposition process, the thermal expansion coefficients of the deposition mask 20 and the frame 15 are not necessarily equivalent to the thermal expansion coefficient of the organic EL substrate 92. In this case, materials other than the iron alloy described above may be used as a material constituting the deposition mask 20. For example, iron alloys other than the iron alloy containing nickel described above, such as iron alloys containing chromium, may be used. Examples of the iron alloys containing chromium which can be used include iron alloys generally known as stainless. Alloys other than iron alloys such as nickel and nickel-cobalt alloy may also be used.

Next, the deposition mask 20 will be described in detail. As shown in FIG. 3, the deposition mask 20 may have a pair of ear portions (first ear portion 17a and second ear portion 17b) including a pair of short side 27 of the deposition mask 20 and an intermediate portion 18 positioned between the pair of ear portions 17a and 17b.

The ear portions 17a and 17b will be described in detail. The ear portions 17a and 17b are portions of the deposition mask 20, which are fixed to the frame 15. In the present embodiment, the ear portions 17a and 17b are formed integrally with the intermediate portion 18. The ear portions 17a and 17b may be composed of a material than other than that of the intermediate portion 18. In this case, the ear portions 17a and 17b are joined to the intermediate portion 18 by welding or the like.

Next, the intermediate portion 18 will be described. The intermediate portion 18 may include at least one effective area 22 through which a through-hole 25 from the first surface 20a to the second surface 20b is formed, and a peripheral area 23 surrounding the effective area 22. The effective area 22 is an area of the deposition mask 20, which faces to the display area of the organic EL substrate 92.

In one embodiment illustrated in FIG. 3, the intermediate portion 18 includes a plurality of effective areas 22 arranged at a determined interval along the long side 26 of the deposition mask 20. One effective area 22 corresponds to one display area of the organic EL display device 100. Thus, according to the embodiment of the deposition mask apparatus 10 illustrated in FIG. 1, the organic EL display device 100 can be subjected to a step-and-repeat vapor deposition. One effective area 22 may correspond to a plurality of display areas.

As shown in FIG. 3, the effective area 22 may have a substantially quadrangular outline in plan view, more precisely, a substantially rectangular outline in plan view. Although not shown, the effective area 22 each can have a variously-shaped outline depending on the shape of the display area of the organic EL substrate 92. For example, the effective area 22 each may have a circular outline. The effective area 22 each may have the same outline as that of the display device of a smart phone or the like.

Figure 4:
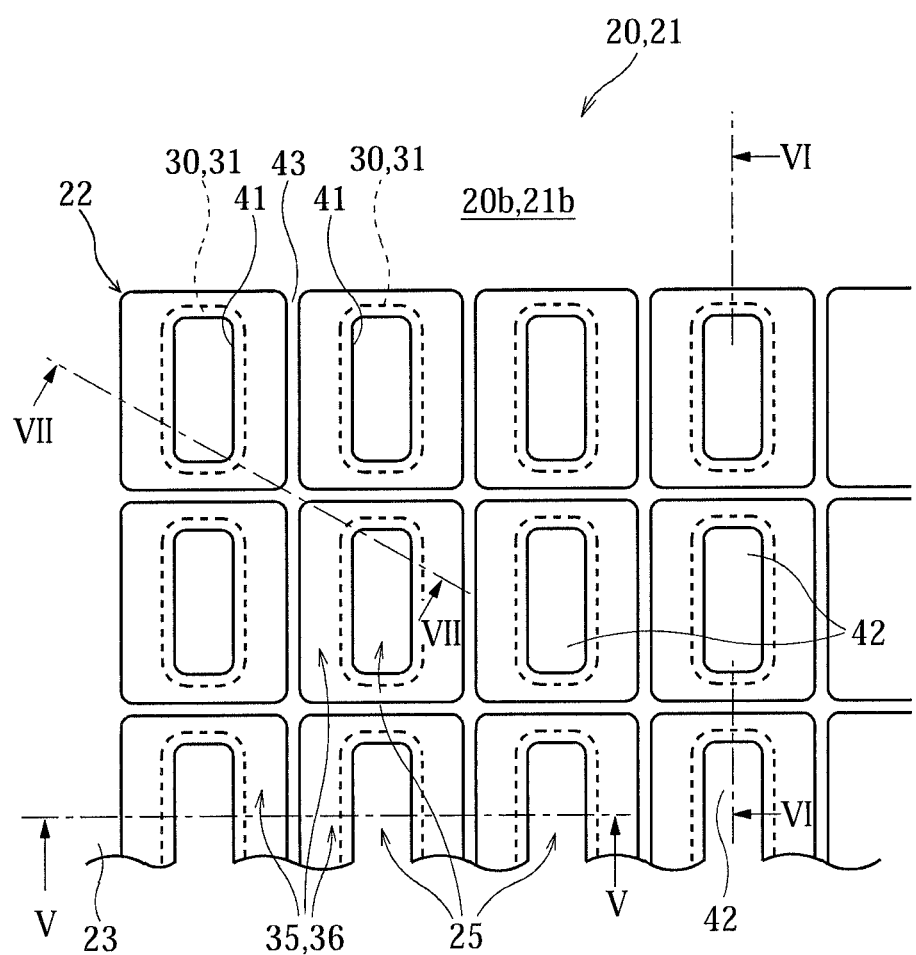
FIG. 4 is a partial plan view showing an effective area of the deposition mask shown in FIG. 3.
Figure 5:
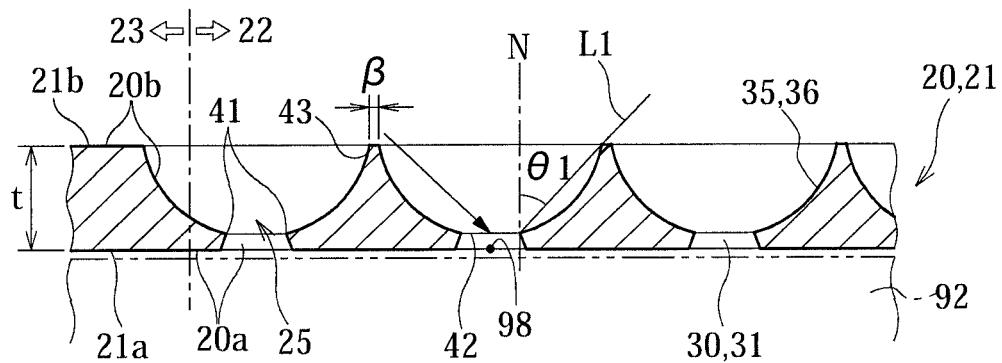
FIG. 5 is a sectional view along the V-V line in FIG. 4.
Figure 6:
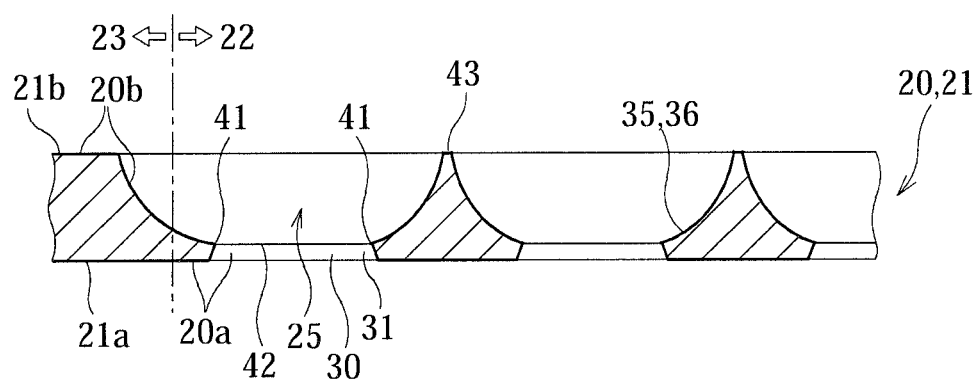
FIG. 6 is a sectional view along the VI-VI line in FIG. 4.
Figure 7:
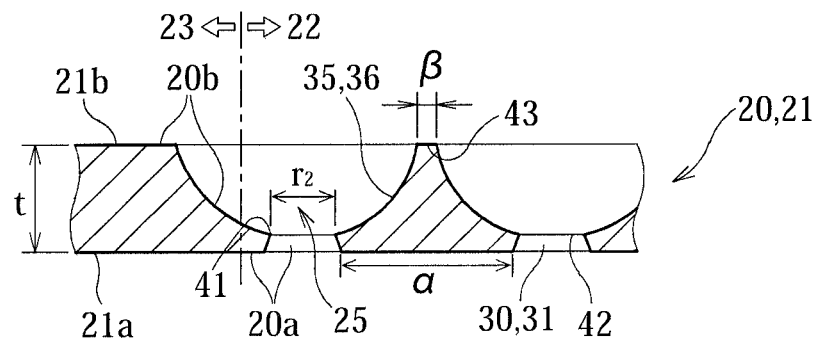
FIG. 7 is a sectional view along the VII-VII line in FIG. 4.

The effective area 22 will be described in detail below. FIG. 4 is an enlarged plan view of the effective area 22 viewed from the second surface 20b side of the deposition mask 20. As shown in FIG. 4, in the illustrated embodiment, the plurality of through-holes 25 formed in effective areas 22 may be arranged in the effective areas 22 at predetermined pitches along two directions perpendicular to each other. An exemplary through-hole 25 will be described in more detail with reference mainly to FIG. 5 to FIG. 7. FIG. 5 to FIG. 7 are cross sectional views of the effective areas 22 in FIG. 4 along the V-V direction, the VI-VI direction, and the VII-VII, respectively.

As shown in FIG. 5 to FIG. 7, a plurality of the through-holes 25 pass through from the first surface 20a, which is one side of the deposition mask 20 along the normal direction N, to the second surface 20b, which is the other side of the deposition mask 20 along the normal direction N. In the illustrated embodiment, as described in more detail below, first recesses 30 are formed in the first surface 21a of the metal plate 21, which is one side of the deposition mask 20 in the normal direction N, by an etching process, and second recesses 35 are formed in the second surface 21b of the metal plate 21, which is the other side of the deposition mask 20 in the normal direction N. Each of the first recesses 30 is connected to each of the second recesses 35, so that the second recess 35 and the first recess 30 are formed to communicate with each other. Each through-hole 25 is composed of the second recess 35 and the first recess 30 connected to the second recess 35.

As shown in FIG. 5 to FIG. 7, an open area of each second recess 35, in a cross section along a plate plane of the deposition mask 20 at each position along the normal direction N of the deposition mask 20, gradually decreases from the side of the second surface 20b to the side of the first surface 20a of the deposition mask 20. Similarly, an open area of each first recess 30, in a cross section along the plate plane of the deposition mask 20 at each position along the normal direction N of the deposition mask 20, gradually decreases from the side of the first surface 20a to the side of the second surface 20b of the deposition mask 20.

As shown in FIG. 5 to FIG. 7, the wall surface 31 of the first recess 30 and the wall surface 36 of the second recess 35 are connected via a circumferential connection portion 41. The connection portion 41 is defined by a ridge line of a bulging portion where the wall surface 31 of the first recess 30, which is inclined with respect to the normal direction N of the deposition mask 20, and the wall surface 36 of the second recess 35, which is inclined with respect to the normal direction N of the deposition mask 20, are merged with each other. The connection portion 41 defines a through-portion 42 where an open area of the through-hole 25 is minimum in plan view of the deposition mask 20.

As shown in FIG. 5 to FIG. 7, the adjacent two through-holes 25 in the other side surface along the normal direction N of the deposition mask 20, i.e., in the first surface 20a of the deposition mask 20, are spaced from each other along the plate plane of the deposition mask 20. Namely, as in the below-described manufacturing method, when the first recesses 30 are made by etching the metal plate 21 from the side of the first surface 21a of the metal plate 21, which will correspond to the first surface 20a of the deposition mask 20, the first surface 21a of the metal plate 21 remains between two adjacent first recesses 30.

Similarly, as shown in FIG. 5 to FIG. 7, the two adjacent second recesses 35 is spaced from each other along the plate plane of the deposition mask 20, on the one side along the normal direction N of the deposition mask 20, i.e., on the side of the second surface 20b of the deposition mask 20. Namely, the second surface 21b of the metal plate 21 remains between two adjacent second recesses 35. In the below description, a portion of the effective area 22 of the second surface 21b of the meal plate 21, which has not been etched and thus remains, is also referred to as top portion 43. By producing the deposition mask 20 such that such top portions 43 remain, the deposition mask 20 can have a sufficient strength. Thus, it can be prevented that the deposition mask 20 is damaged during transportation, for example. However, when the width β of the top portion 43 is too large, there is a possibility that shadow occurs in the deposition step, which lowers utilization efficiency of the deposition material 98. Thus, the deposition mask 20 is preferably produced such that the width β of the top portion 43 is not excessively large. For example, the width β of the top portion 43 is preferably 2 μm or less. In general, the width β of the top portion 43 varies depending on the direction along which the deposition mask 20 is cut. For example, the widths β of the top portion 43 shown in FIG. 5 to FIG. 7 may differ from each other. In this case, the deposition mask 20 may be formed such that the width β of the top portion 43 is 2 μm or less, regardless of the direction along which the deposition mask 20 is cut. The shadow is a phenomenon where adhering of a deposition material to an area of a deposition target such as the organic EL substrate 92, which the area overlaps with a through-hole of the deposition mask 20, is inhibited by the second surface 20b or the wall surface of the deposition mask 20.

When the deposition mask apparatus 10 is received in the deposition apparatus 90 as shown in FIG. 1, the first surface 20a of the deposition mask 20 faces to the organic EL substrate 92 as shown by the two-dot chain lines in FIG. 5, while the second surface 20b of the deposition mask 20 is located on the side of the crucible 94 holding the deposition material 98. Thus, the deposition material 98 adheres to the organic EL substrate 92 through the second recess 35 whose open area gradually decreases. As shown by the arrow in FIG. 5 extending from the second surface 20b toward the first surface 20a, the deposition material 98 not only moves from the crucible 94 toward the organic EL substrate 92 along the normal direction N of the organic EL substrate 92, but also sometimes moves along a direction largely inclined with respect to the normal direction N of the organic EL substrate 92. During the inclined movement, when the thickness of the deposition mask 20 is large, the deposition material 98 moving at an angle is likely to be caught by the top portion 43, the wall surface 36 of the second recess 35, and the wall surface 31 of the first recess 30, so that the proportion of the deposition material 98 which fails to pass through the through-hole 25 increases. Thus, in order to improve the utilization efficiency of the deposition material 98, it is considered to be preferable that the thickness t of the deposition mask 20 is reduced so that the heights of the wall surface 36 of the second recess 35 and the wall surface 31 of the first recess 30 are reduced. Namely, it can be said that it is preferable that a metal plate 21 having as small a thickness t as possible within a range ensuring the strength of the deposition mask 20, is used as the metal plate 21 for forming the deposition mask 20. In consideration of this point, the thickness t of the deposition mask 20 in the present embodiment is, for example, 30 μm or less, preferably 25 μm or less, more preferably 20 μm or less. The thickness t of the deposition mask 20 may be 18 μm or less, or 15 μm or less. However, when the thickness of the deposition mask 20 is too small, the strength of the deposition mask 20 decreases, so that the deposition mask 20 is likely to be damaged or deformed. In consideration of this point, the thickness t of the deposition mask 20 may be 5 μm or more, 7 μm or more, 10 μm or more, 13 μm or more, or 15 μm or more. The thickness t is the thickness of the peripheral area 23, i.e., the thickness of a portion of the deposition mask 20 where the first recess 30 and the second recess 35 are not formed. Therefore, the thickness t can be said as the thickness of the metal plate 21.

The range of the thickness t of the deposition mask 20 may be defined by a combination of any one of the upper limit candidates described above and any one of the lower limit candidates described above. For example, the thickness t of the deposition mask 20 may be 5 μm or more and 30 μm or less, 7 μm or more and 25 μm or less, 10 μm or more and 20 μm or less, or 13 μm or more and 18 μm or less. Alternatively, the range of the thickness t of the deposition mask 20 may be defined by a combination of any two of the upper limit candidates described above. For example, the thickness t of the deposition mask 20 may be 25 μm or more and 300 μm or less. Alternatively, the range of the thickness t of the deposition mask 20 may be defined by a combination of any two of the lower limit candidates described above. For example, the thickness t of the deposition mask 20 may be 5 μm or more and 7 μm or less.

In FIG. 5, a minimum angle defined by a line L1, which passes through the connection portion 41 having the minimum open area of the through-hole 25 and another given position of the wall surface 36 of the second recess 35, with respect to the normal direction N of the deposition mask 20, is represented by a symbol $\theta 1$. In order to allow the diagonally moving deposition material 98 to reach the organic EL substrate 92 as much as possible without allowing it to reach the wall surface 36, it is advantageous that the angle $\theta 1$ is increased. In order to increase the angle $\theta 1$, it is effective to reduce the above-described width β of the top portion 43, as well as to reduce the thickness t of the deposition mask 20.

In FIG. 7, the symbol a represents a width of a portion of the effective area 22 of the first surface 21a of the metal plate 21, which has not been etched and thus remains (hereinafter also referred to as "rib portion"). The width α of the rib portion and the size $r_2$ of the through-portion 42 are suitably determined depending on the size of the organic EL display device and its display pixels. For example, the width α of the rib portion is 5 μm or more and 40 μm or less, while the size $r_2$ of the through-portion 42 is 10 μm or more and 60 μm or less.

The width α of the rib portion may be 10 μm or more, 15 μm or more, or 20 μm or more. The width α of the rib portion may be 35 μm or less, 30 μm or less, or 25 μm or less. The range of the width α of the rib portion may be defined by a combination of any one of the upper limit candidates described above and any one of the lower limit candidates described above. For example, the width α of the rib portion may be 10 μm or more and 35 μm or less, 15 μm or more and 30 μm or less, or 20 μm or more and 25 μm or less. Alternatively, the range of the width α of the rib portion may be defined by a combination of any two of the upper limit candidates described above. For example, the width α of the rib portion may be 35 μm or more and 40 μm or less. Alternatively, the range of the width α of the rib portion may be defined by a combination of any two of the lower limit candidates described above. For example, the width α of the rib portion may be 5 μm or more and 10 μm or less.

The size $r_2$ of the through-portion 42 may be 15 μm or more, 20 μm or more, 25 μm or more, or 30 μm or more. The lower limit of the size $r_2$ of the through-portion 42 may be less than 10 μm described above. For example, the size r of the through-portion 42 is 5 μm or more. The size $r_2$ of the through-portion 42 may also be 55 μm or less, 50 μm or less, 45 μm or less, 40 μm or less, or 35 μm or less. The range of the size $r_2$ of the through-portion 42 may be defined by a combination of any one of the upper limit candidates described above and any one of the lower limit candidates described above. For example, the size $r_2$ of the through-portion 42 may be 15 μm or more and 55 μm or less, 20 μm or more and 50 μm or less, 25 μm or more and 45 μm or less, 30 μm or more and μm or less, or 30 μm or more and 35 μm or less. Alternatively, the range of the size $r_2$ of the through-portion 42 may be defined by a combination of any two of the upper limit candidates described above. For example, the size $r_2$ of the through-portion 42 may be 55 μm or more and 60 μm or less. Alternatively, the range of the size $r_2$ of the through-portion 42 may be defined by a combination of any two of the lower limit candidates described above. For example, the size $r_2$ of the through-portion 42 may be 5 μm or more and 10 μm or less.

Figure 8:
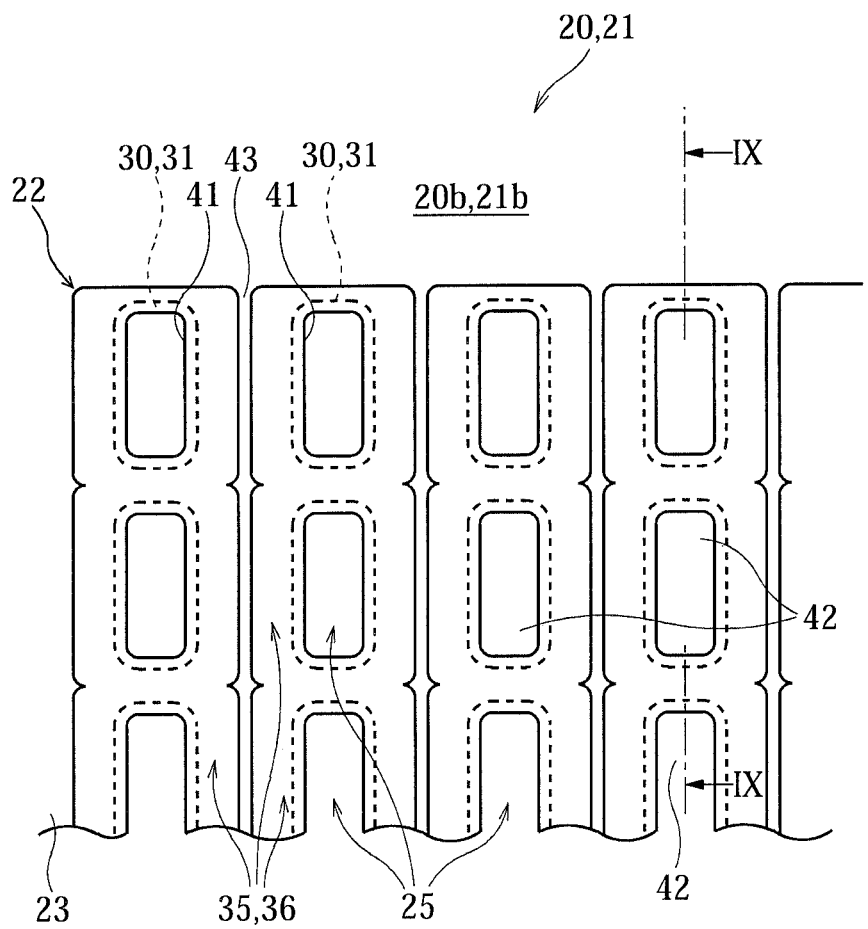
FIG. 8 is a partial plan view showing a modification of the effective area of the deposition mask.
Figure 9:
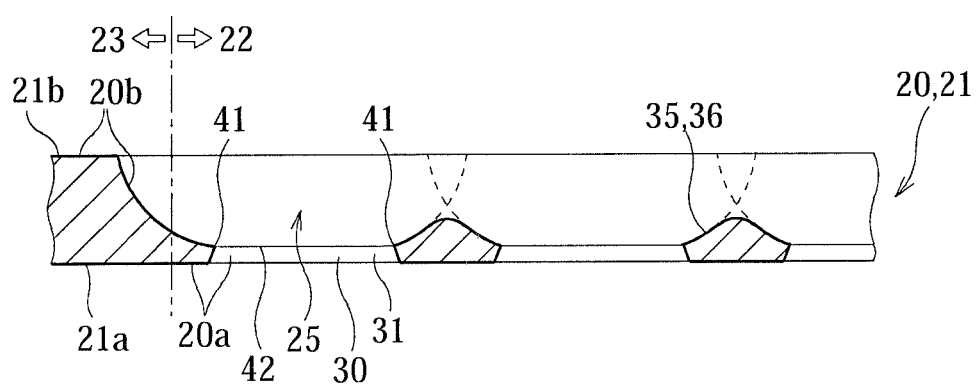
FIG. 9 is a sectional view along the IX-IX line in FIG. 8.

While embodiments are shown in FIG. 4 to FIG. 7, where the second surface 21b of the metal plate 21 remains between two adjacent second recesses 35, the present invention is not restricted to these embodiments. As shown in FIG. 8, the etching process may be performed such that two adjacent second recesses 35 are connected to each other, depending on their positions. Namely, there may be a portion where no second surface 21b of the metal plate 21 remains between two adjacent second recesses 35. Although not shown, the etching process may be performed such that two adjacent second recesses 35 are connected to each other over the entire area of the second surface 21b. FIG. 9 is a sectional view of the effective area 22 along the IX-IX direction in FIG. 8.

Figure 10:
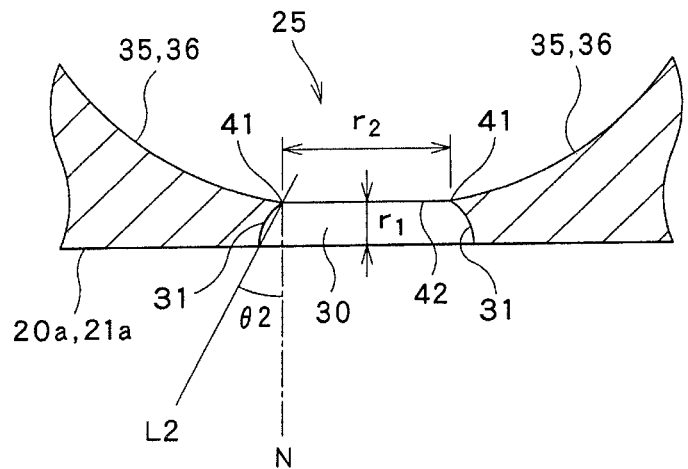
FIG. 10 is an enlarged sectional view showing a through-hole and an area near thereto.

Although not limited, the deposition mask 20 according to the present embodiment is particularly effective when an organic EL display device having a pixel density of 450 ppi or more is produced. Hereinafter, an exemplary size of the deposition mask 20 required for producing an organic EL display device having such a high pixel density is described with reference to FIG. 10. FIG. 10 is an enlarged sectional view showing the through-hole 25 of the deposition mask 20 shown in FIG. 5 and an area near thereto.

In FIG. 10, as parameters related to the shape of the through-hole 25, a distance from the first surface 20a to the connection portion 41 of the deposition mask 20 along the normal direction N of the deposition mask 20, i.e., the height of the wall surface 31 of the first recess 30, is represented by a symbol $r_1$. Further, the size of the first recess 30 in a portion where the first recess 30 is connected to the second recess 35, i.e., the size of the through-portion 42, is represented by a symbol $r_2$. In addition, in FIG. 10, an angle that is defined by a line $L_2$, which connects the connection portion 41 and a distal edge of the first recess 30 in the first surface 21b of the metal plate 21, with respect to the normal line N of the metal plate 21, is represented by a symbol $\theta2$.

When an organic EL display device having a pixel density of 450 ppi or more is produced, the size $r_2$ of the through-portion 42 is preferably set as 10 μm or more and 60 μm or less. When the size is within the range, a deposition mask 20 can be provided, by which an organic EL display device having a high pixel density can be produced. Preferably, the height $r_1$ of the wall surface 31 of the first recess 30 is set as 6 mm or less.

Next, the angle $\theta2$ described above shown in FIG. 10 will be described. The angle $\theta2$ corresponds to the maximum inclined angle of a deposition material 98 that can reach the organic EL substrate 92, out of deposition materials 98 that comes in an inclined manner with respect to the normal direction N of the metal plate 21 and passes through the through-portion 42 near the connection portion 41. This is because the deposition material 98 coming through the connection portion 41 at an inclined angle greater than the angle $\theta2$ adheres to the wall surface 31 of the first recess 30 before reaching the organic EL substrate 92. Thus, by decreasing the angle $\theta2$, adhering of the deposition material 98 coming at a large inclined angle and passing through the through-portion 42 to the organic EL substrate 92 can be prevented. This can prevent the deposition material 98 from adhering to a portion of the organic EL substrate 92, which is outside the portion overlapping with the through-portion 42. Namely, a decrease in the angle $\theta2$ leads to reduction of variation in the area and the thickness of the deposition material 98 adhered to the organic EL substrate 92. From this point of view, the through-hole 25 is formed such that the angle $\theta2$ is 45 degrees or less. FIG. 10 shows an embodiment in which the size of the first recess 30 in the first surface 21a, i.e., an opening size of the through-hole 25 in the first surface 21a is larger than the size $r_2$ of the first recess 30 in the connection portion 41. Namely, the value of the angle $\theta2$ is a positive value in the illustrated embodiment. However, although not shown, the size $r_2$ of the first recess 30 at the connection portion 41 may be larger than the size of the first recess 30 in the first surface 21a. Namely, the value of the angle $\theta2$ may be a negative value.

Next, a method for manufacturing the deposition mask 20 will be described.

First, a manufacturing method for a metal plate used for manufacturing the deposition mask is described. In the present embodiment, a method in which the metal plate is composed of a rolled material that is an iron alloy containing nickel is described. The rolled material may have a thickness of 30 μm or less. The rolled material may contain 30% by mass or more and 38% by mass or less of nickel, 0% by mass or more and 6% by mass or less of cobalt, the balance of iron, and unavoidable impurities.

First, iron, nickel and other materials are prepared. For example, the materials are prepared so that the ratios of iron and nickel, with respect to the entire materials, are about 64% by weight and about 36% by weight, respectively. After crushing of the materials as necessary, a melting step for melting the materials in a melting furnace is performed. For example, the materials are melted by utilizing gas discharge such as arc discharge and mixed. This can provide a base material for the metal plate.

The temperature during melting is set depending on the materials. For example, the temperature is 1,500° C. or higher. The melting step may include a step of adding aluminum, manganese, silicon or the like to the melting furnace for deoxidization, dehydration, denitrification, or the like. The melting step may be performed in an atmosphere of an inert gas such as argon gas in a subatmospheric low-pressure condition.

After the base material is removed from the melting furnace, a step of removing the surface of the base material may be performed. Oxide films such as scale can be removed in this step. Specific examples of the removing method which can be employed include, but not limited to, a so-called grinding method in which the surface of the base material is removed on a rotating grinding wheel, and a so called milling method in which the surface of base material is removed by pressing the base material to a cutting tool. The step may be performed so that the base material has a uniform thickness.

Figure 11:
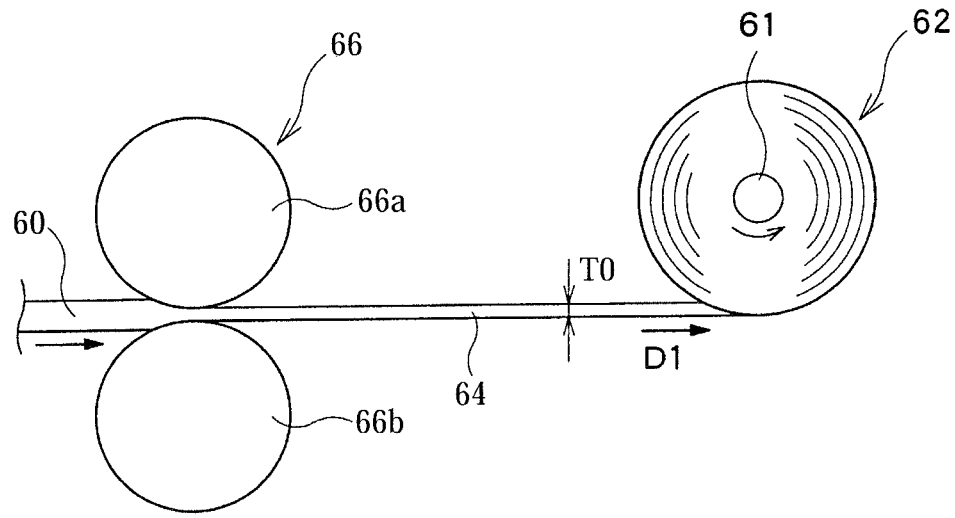
FIG. 11 is a view showing a step of rolling a base material to obtain a metal plate having a desired thickness.

Next, as shown in FIG. 11, a rolling step for rolling a base material 60 composed of an iron alloy containing nickel. For example, the base material 60 is transported toward a rolling apparatus 66 including a pair of reduction rolls 66a and 66b (work roll) while applying a tensile tension in the direction shown by the arrow D1. The base metal 60 having reached between the pair of reduction rolls 66a and 66b is rolled by the pair of reduction rolls 56a and 56b, so that the thickness of the base metal 60 is reduced and is elongated along the transport direction. As a result, a metal plate 64 having a thickness T0 can be obtained. As shown in FIG. 11, a winding body 62 may be formed by winding up the metal plate 64 around a core 61.

FIG. 11 only illustrates a schematic of the rolling step and does not particularly limit the specific compositions and procedure for performing the rolling step. For example, the rolling step may include a hot rolling step of processing the base metal at a temperature not less than a temperature at which the crystalline orientation of the iron alloy constituting the base metal 60 changes, and a cold rolling step of processing the base metal at a temperature not more than a temperature at which the crystalline orientation of the iron alloy changes. In addition, the direction in which the base metal 60 or the metal plate 64 passes through between the pair of reduction rolls 66a and 66b is not limited to one direction. For example, in FIG. 11 and FIG. 12, the base metal 60 or the metal plate 64 may be gradually rolled by repeatedly passing the base metal 60 or the metal plate 64 through between the pair of reduction rolls 66a and 66b in the direction from left to right in the drawings and in the direction from right to left in the drawings.

In the rolling step, the diameters of the reduction rolls 66a and 66b to be in contact with the base material 60 can be adjusted to control the surface roughness of the metal plate

64. For example, when the diameters of the reduction rolls 66a and 66b are decreased, the volumes of pits present in the surface of the metal plate 64 described later can be decreased. This allows the corrected pit volume density described later to be 15000 $\mu m^3/mm^2$ or less, for example.

Preferably, the diameter of the reduction roll is 28 mm or more. The diameter of the reduction roll may be 40 mm or more, or 50 mm or more. Preferably, the diameter of the reduction roll is 150 mm or less. The diameter of the reduction roll may be 120 mm or less, 100 mm or less, or 80 mm or less.

The range of the diameter of the reduction roll may be defined by a combination of any one of the upper limit candidates and any one of the lower limit candidates. For example, the diameter of the reduction roll may be 28 mm or more and 150 mm or less, or 40 mm or more and 120 mm or less. Alternatively, the range of the diameter of the reduction roll may be defined by a combination of any two of the upper limit candidates. For example, the diameter of the reduction roll may be 120 mm or more and 150 mm or less. Alternatively, the range of the diameter of the reduction roll may be defined by a combination of any two of the lower limit candidates. For example, the diameter of the reduction roll may be 28 mm or more and 40 mm or less. The diameter of the reduction roll is preferably 28 mm or more and 150 mm or less, more preferably 40 mm or more and 120 mm or less, still more preferably 50 mm or more and 100 mm or less, still more preferably 50 mm or more and 80 mm or less.

In the rolling step, the pressure by a rolling actuator may also be adjusted to control the shape of the metal plate 64. In addition to the reduction rolls (work rolls) 66a and 66b, the backup roll may be adjusted as appropriate for the shape, and may be adjusted as appropriate for the position in the board width direction.

In the rolling step, the rolling speed, i.e., the transport speed of the base material may also be adjusted. From the viewpoint of further reduction of the corrected pit volume density, the rolling speed is preferably slowed. When the rolling speed is slowed, the amount of a coolant such as rolling oil caught between the base material 60 and the reduction rolls 66a and 66b can be decreased. This can reduce the number, area, or the like of oil pits formed on the surface of the metal plate 64.

Preferably, the rolling speed is 30 m/min or more. The rolling speed may be 50 m/min or more, 70 m/min or more, or 100 m/min or more. Preferably, the rolling speed is 200 m/min or less. The rolling speed may be 150 m/min or less, 100 m/min or less, or 80 m/min or less.

The rolling speed may be defined by a combination of any one of the upper limit candidates and any one of the lower limit candidates. For example, the rolling speed may be 30 m/min or more and 200 m/min or less, or 50 m/min or more and 150 m/min or less. Alternatively, the range of the rolling speed may be defined by a combination of any two of the upper limit candidates. For example, the rolling speed may be 150 m/min or more and 200 m/min or less, or 100 m/min or more and 150 m/min or less. Alternatively, the range of the rolling speed may be defined by a combination of any two of the lower limit candidates. For example, the range of the rolling speed may be 30 m/min or more and 50 m/min or less, or 50 m/min or more and 70 m/min or less. The rolling speed is preferably 30 m/min or more and 200 m/min or less, more preferably 30 m/min or more and 150 m/min or less, still more preferably 30 m/min or more and 100 m/min or less, still more preferably 30 m/min or more and 80 m/min or less.

In the cold rolling step, a coolant such as kerosene or neat oil may be supplied between the base material 60 and the reduction rolls 66a and 66b. This can regulate the temperature of the base material. From the viewpoint of further reduction of the corrected pit volume density, the supply of the coolant is preferably decreased.

An appropriate selection of the coolant can also control the number, area, or the like of oil pits or rolling seams formed on the surface of the metal plate 64. For example, a neat oil can be used as the coolant. Neat oils have a characteristic that little increase in the viscosity during rolling occurs. Thus, when a neat oil is used as the coolant, the amount of the coolant caught between the base material 60 and the reduction rolls 66a and 66b can be decreased. This can prevent formation of oil pits on the surface of the metal plate 64.

An appropriate selection of the surface roughness of the reduction roll can also control the number, area, or the like of oil pits or rolling seams formed on the surface of the metal plate 64. For example, when the surface roughness Ra of the reduction roll is decreased, formation of rolling seams on the surface of the metal plate 64 can be reduced. Preferably, the surface roughness Ra of the reduction roll is 0.2 μm or less. The surface roughness Ra of the reduction roll may be 0.15 μm or less, 0.1 μm or less, or 0.05 μm or less. Preferably, the surface roughness Rz of the reduction roll is 2.0 μm or less. The surface roughness Rx of the reduction roll may be 1.5 μm or less, 1.0 μm or less, or 0.5 μm or less. Preferably, the surface roughness Rz of the reduction roll is 2.0 μm or less. The surface roughness Rz of the reduction roll may be 1.5 μm or less, 1.0 μm or less, or 0.5 μm or less. The surface roughnesses Ra and Rz are measured according to JIS B 0601 (2013).

An analysis step for analyzing the quality and properties of the base material 60 or the metal plate 64 may be performed before, after or during the rolling step. For example, the base material 60 or the metal plate 64 may be irradiated with a fluorescent X-ray in order to analyze the composition. A thermomechanical analysis (TMA) may be performed to measure the amount of thermal expansion in the base material 60 or the metal plate 64.

Figure 12:
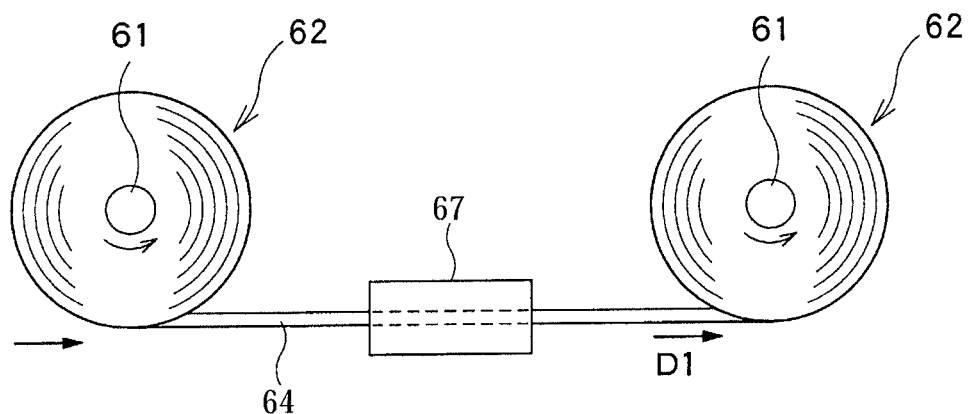
FIG. 12 is a view showing a step of annealing the metal plate obtained by rolling.

After that, in order to remove the residual stress accumulated in the metal plate 64 during the rolling, an annealing step for annealing the metal plate 64 using an annealing apparatus 67 may be performed as shown in FIG. 12. As shown in FIG. 12, the annealing step may be performed while the metal plate 64 being pulled in the transport direction (longitudinal direction). Namely, the annealing step may be performed as a continuous annealing process while the metal plate being transported, instead of a batch annealing process. In this case, the temperature and the transport speed are preferably set so that deformation, such as breakage due to buckling, in the metal plate 64 is prevented. When the annealing step is performed, the metal plate 64 from which the residual strain is removed to some extent can be obtained. While FIG. 12 illustrates an embodiment in which the metal plate 64 is transported in a horizontal direction during the annealing step, the present invention is not limited to this embodiment, and the metal plate 64 may be transported in the other direction such as vertical direction during the annealing step.

The conditions of the annealing step are suitably set depending on, for example, the thickness and draft of the metal plate 64. For example, the annealing step is performed in a temperature range of 500° C. or higher and 600° C. or lower for a period of time of 30 seconds or longer and 90 seconds or shorter. The number of seconds described above represents a time needed for the metal plate 64 to pass through the space adjusted to a predetermined temperature in the annealing apparatus 67. The temperature of the annealing step may be set not to cause softening of the metal plate 64.

The lower limit of the temperature of the annealing step may be lower than 500° C. described above. For example, the temperature of the annealing step may be 400° C. or higher, or 450° C. or higher. The upper limit of the temperature of the annealing step may be higher than 600° C. described above. For example, the temperature of the annealing step may be 700° C. or lower, or 650° C. or lower. The range of the temperature of the annealing step may be defined by a combination of any one of the upper limit candidates described above and any one of the lower limit candidates described above. For example, the temperature of the annealing step may be 400° C. or higher and 700° C. or lower, or 450° C. or higher and 650° C. or lower. Alternatively, the range of the temperature of the annealing step may be defined by a combination of any two of the upper limit candidates described above. For example, the temperature of the annealing step may be 650° C. or higher and 700° C. or lower. Alternatively, the range of the temperature of the annealing step may be defined by a combination of any two of the lower limit candidates described above. For example, the temperature of the annealing step may be 400° C. or higher and 450° C. or lower.

The duration of the annealing step may be 40 seconds or longer, or 50 seconds or longer. The lower limit of the duration of the annealing step may be shorter than 30 seconds described above. For example, the duration of the annealing step may be 10 seconds or longer, or 20 seconds or longer. The duration of the annealing step may be 80 seconds or shorter, 70 seconds or shorter, or 60 seconds or shorter. The upper limit of the duration of the annealing step may be longer than 90 seconds described above. For example, the duration of the annealing step may be 100 seconds or shorter. The range of the duration of the annealing step may be defined by a combination of any one of the upper limit candidates described above and any one of the lower limit candidates described above. For example, the duration of the annealing step may be 10 seconds or longer and 100 seconds or shorter, 20 seconds or longer and 90 seconds or shorter, 30 seconds or longer and 80 seconds or shorter, 40 seconds or longer and 70 seconds or shorter, or 50 seconds or longer and 60 seconds or shorter. Alternatively, the range of the duration of the annealing step may be defined by a combination of any two of the upper limit candidates described above. For example, the duration of the annealing step may be 90 seconds or longer and 100 seconds or shorter. Alternatively, the range of the duration of the annealing step may be defined by a combination of any two of the lower limit candidates described above. For example, the duration of the annealing step may be 10 seconds or longer and 20 seconds or shorter.

Preferably, the annealing step described above is performed in a non-reducing atmosphere or an inert gas atmosphere. As used herein, the term "non-reducing atmosphere" means an atmosphere free of reducing gas such as hydrogen. The expression "free of reducing gas" means that the concentration of reducing gas such as hydrogen is 10% or less. In the annealing step, the concentration of reducing gas may be 8% or less, 6% or less, 4% or less, 2% or less, or 1% or less. The term "inert gas atmosphere" means an atmosphere where the concentration of inert gas such as argon gas, helium gas, or nitrogen gas is 90% or more. In the annealing step, the concentration of inert gas may be 92% or more, 94% or more, 96% or more, 98% or more, or 99% or more. When the annealing step is performed in a non-reducing atmosphere or an inert gas atmosphere, generation of nickel compounds such as nickel hydroxide on the surface layer of the metal plate 64 can be prevented. The annealing apparatus 67 may include a mechanism for monitoring the concentration of inert gas and a mechanism for controlling the concentration of inert gas.

A washing step for washing the metal plate 64 may be performed before the annealing step. This can prevent adhering of foreign substances to the surface of the metal plate 64 during the annealing step. For example, a hydrocarbon solution can be used as a washing solution for the washing.

While FIG. 12 illustrates an embodiment in which the annealing step is performed while the metal plate 64 being pulled in the longitudinal direction, the present invention is not limited to this embodiment, and the annealing step may be performed with the metal plate 64 being in a state where it is wound around the core 61. Namely, the batch annealing process may be performed. When the annealing step is performed with the metal plate 64 being in a state where it is wound around the core 61, the metal plate 64 may have a warping tendency corresponding to a winding diameter of the winding body 62. Thus, depending on the winding diameter of the winding body 62 and the material forming the base metal 60, it is advantageous to perform the annealing step while the metal plate 64 being pulled in the longitudinal direction.

After that, there may be performed a slitting step of slitting both ends of the metal plate 64 obtained by the rolling step over a predetermined range in the width direction so that the width of the metal plate 64 is within a predetermined range. The slitting step is performed to remove a crack that may be generated at both ends of the metal plate 64 due to the rolling step. When the slitting step is performed, a phenomenon where the metal plate 64 is broken from the crack, which is so-called plate incision, can be prevented.

The widths of the portions to be slit in the slitting step may be adjusted so that the shape of the metal plate 64 after the slitting step is symmetric in the width direction. The slitting step may be performed before the annealing step described above.

At least two steps of the rolling step, the annealing step and the slitting step described above may be repeated multiple times to prepare an elongated metal plate 64 having a predetermined thickness.

After the rolling step, or after the annealing step, an appearance inspection step for inspecting the appearance of the metal plate 64 may be performed. The appearance inspection step may include a step of inspecting the appearance of the metal plate 64 using an automatic inspection machine. The appearance inspection step may also include a step of visually inspecting the appearance of the metal plate 64.

After the rolling step, or after the annealing step, a shape inspection step for inspecting the shape of the metal plate 64 may be performed. For example, the position of the surface of the metal plate 64 in the thickness direction may be determined within a predetermined area of the metal plate 64 using a coordinate measuring machine.

Figure 13:
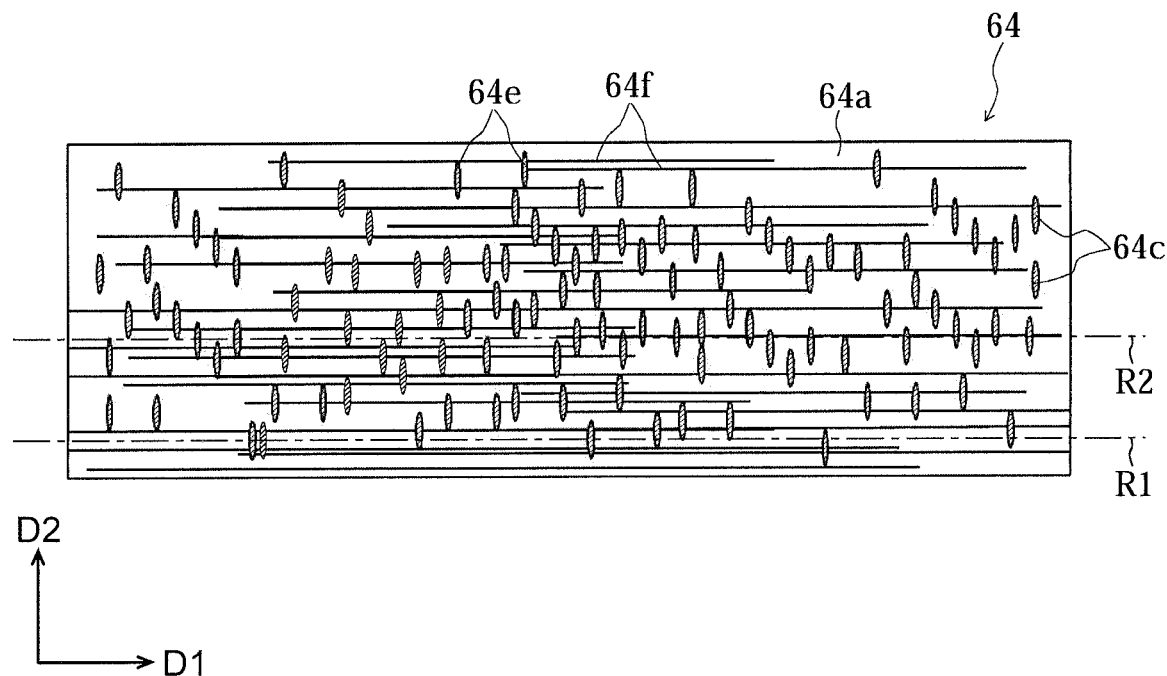
FIG. 13 is a view showing how a plurality of pits exist in the surface of the metal plate obtained by rolling.

As a result of extensive studies by the present inventors, it has been found that the surface of the metal plate 64 after rolling has many pits. FIG. 13 is a view showing how a plurality of pits 64c exist in the surface of the metal plate 64 obtained by rolling, for example, in the first surface 64a. The pit 64*c* is, for example, an oil pit 64*e* or a rolling seam 64*f*. The oil pit 64*e* is a recess formed in the surface of the metal plate 64 due to oil present between the base material 60 and the reduction rolls 66*a* and 66*b*. In the present embodiment, the pit 64*c* refers to a recess having a depth of 0.2 µm or more, of recesses such as oil pit 64*e* present in the surface of the metal plate 64. The density of pits 64*c* present in the surface of the metal plate 64 is, for example, 3 per mm² or more and 500 per mm² or less. The numerical value 0.2 µm is a preferable value of the correction distance dC described later. The size of the pit 64*c* in the surface direction of the metal plate 64 is, for example, 1 µm or more and 60 µm or less.

Known techniques for inspecting irregularities such as pits 64*c* in the surface of the metal plate 64 include a technique of determining the arithmetic average roughness (Ra) and the maximum height (Ry) of the surface. For both of the arithmetic average roughness (Ra) and the maximum height (Ry), the position of the surface of the metal plate 64 in the thickness direction is determined at a plurality of points on a given line such as line R1 or R2 shown in FIG. 13. As shown in FIG. 13, the density of the pits 64*c* may vary depending on the place. As a result, as shown in FIG. 13, the density of the pits 64*c* positioned on the line R2 can be significantly lower than the density of the pits 64*c* positioned on the line R1. Thus, in the techniques such as for the arithmetic average roughness (Ra) and the maximum height (Ry), the variation in inspection results can be relatively large.

Figure 14:
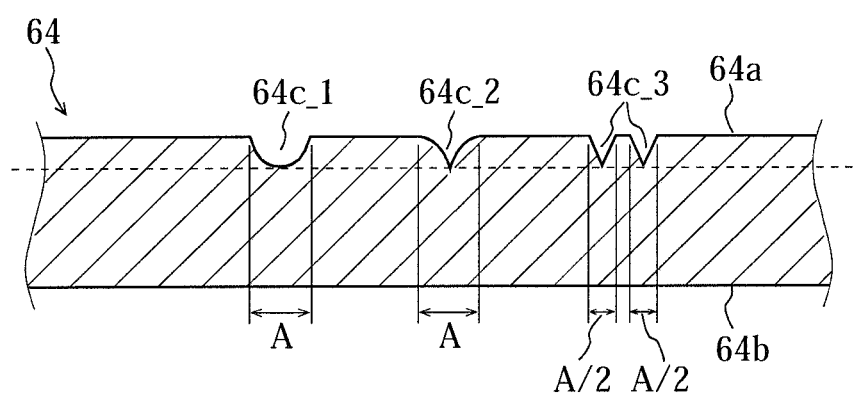
FIG. 14 is a view showing an exemplary cross section of the metal plate.

Further, it is considered that sufficient information on the shape and the volume of pit 64*c* cannot be obtained by the techniques such as for the arithmetic average roughness (Ra) and the maximum height (Ry). Such problems with the arithmetic average roughness (Ra) and the maximum height (Ry) will be described with reference to FIG. 14. FIG. 14 is a view showing an exemplary cross section of the metal plate 64.

FIG. 14 shows three types of pits. The pit 64*c*_1 located on the left side and the pit 64*c*_2 located at the center have the same opening diameter A. The wall surface of the pit 64*c*_1 has a shape that is convex toward the metal plate. On the other hand, the wall surface of the pit 64*c*_2 has a shape that is convex outward, as opposed to the pit 64*c*_1. The two pits 64*c*_3 located on the right side have an opening diameter A/2. Thus, the sum of the opening diameters of the two pits 64*c*_3 is the same as each of the opening diameter of the pit 64*c*_1 and the opening diameter of the pit 64*c*_2. The depths of the three types of pits 64*c*_1, 64*c*_2 and 64*c*_3 are all B.

When the surface roughness due to the three types of pits 64*c*_1, 64*c*_2, and 64*c*_3 is measured with a measuring device, the arithmetic average roughness (Ra) is represented by the following formula:

$$Ra = \int A \times B/2 \, dx$$

Thus, the influence which the three types of pits 64*c*_1, 64*c*_2, and 64*c*_3 have on the measured value of the arithmetic average roughness (Ra) is the same.

Figure 15:
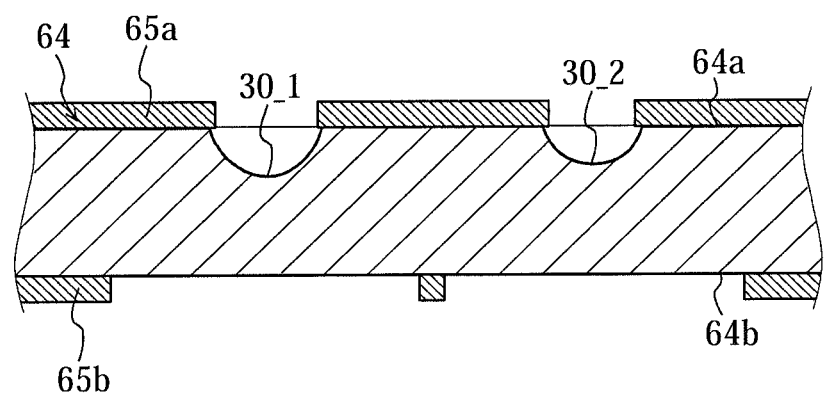
FIG. 15 is a sectional view showing a step of forming first recesses by etching the metal plate shown in FIG. 14 from the first surface side.
Figure 16:
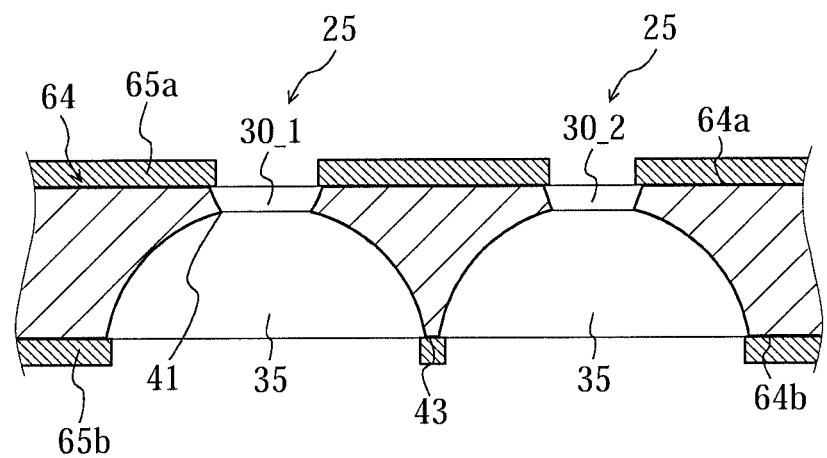
FIG. 16 is a sectional view showing a step of forming second recesses each communicating with a first recess on the second surface side of the metal plate.
Figure 17:
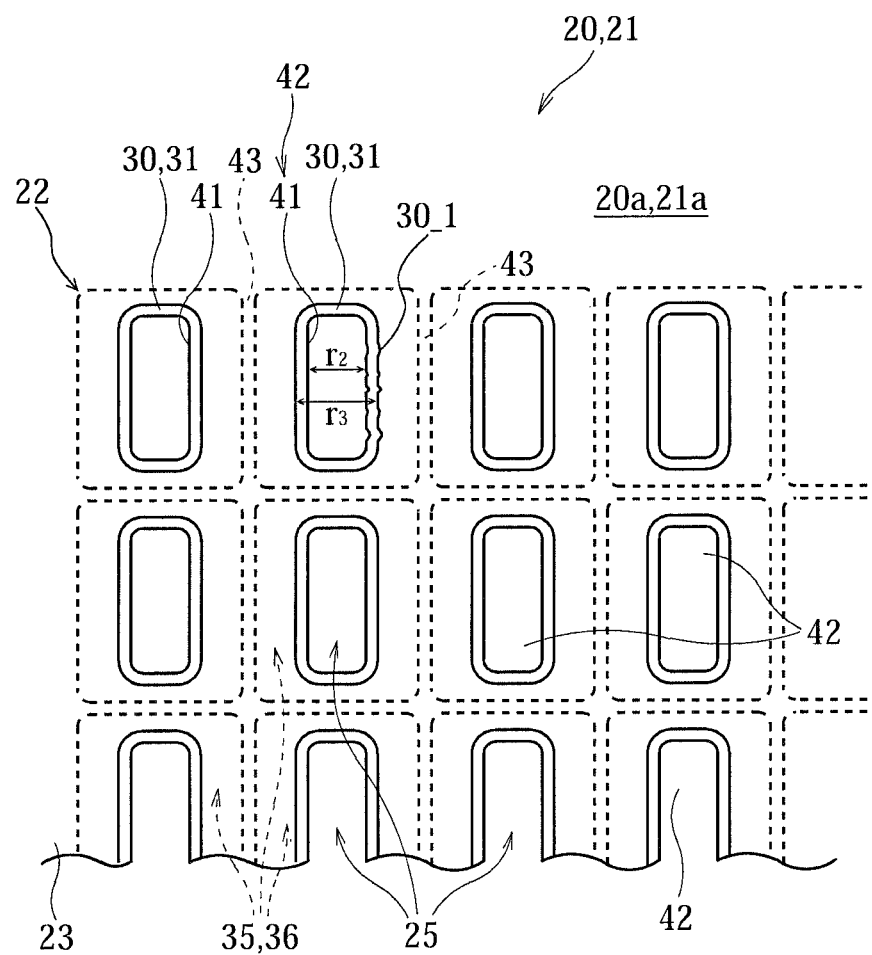
FIG. 17 is a view for illustrating how the precision of the opening size of the through-hole is lowered due to pits in the metal plate.

On the other hand, as shown in FIG. 15 to FIG. 17, the sizes of the through-hole 25, the first recess 30, the second recess 35, the top portion 43, the rib portion, and the like that are formed by etching of the metal plate 64 are affected not only by the depth of the pit 64*c* but also by the volume of the pit 64*c*. As described later, in the present embodiment, the surface roughness is evaluated based on the volume of the pit. In this case, the influences of the three types of pits 64*c*_1, 64*c*_2 and 64*c*_3 on the corrected pit volume density described later are different. Specifically, the influence of the pit 64*c*_1 on the corrected pit volume density is largest. The influence of one pit 64*c*_2 on the corrected pit volume density is smaller than the influence of two pits 64*c*_3 on the corrected pit volume density.

FIG. 15 is a sectional view showing a step of forming the first recess 30 by etching the metal plate 64 shown in FIG. 14 with a first resist pattern 65*a* as a mask from the first surface 64*a* side. The volume of the pit 64*c*_1 on the left side is larger than that of the pit 64*c*_2 on the right side. Therefore, at the place where the pit 64*c*_1 on the left side has been present, the etching progresses in the thickness direction and the surface direction of the metal plate 64 more quickly than at the place where the pit 64*c*_2 on the right side has been present. Therefore, the size of the first recess 30_1 formed at the place where the pit 64*c*_1 on the left side has been present is larger than the size of the first recess 30_2 formed at the place where the pit 64*c*_2 on the right side has been present.

FIG. 16 is a sectional view showing a step of forming the second recesses 35 each communicating with the first recess 30_1 or 30_2 on the second surface 64*b* side of the metal plate 64, by etching the metal plate 64 shown in FIG. 15 with a second resist pattern 65*b* as a mask from the second surface 64*b* side. Since the size of the first recess 30_1 on the left side is larger than the size of the first recess 30_2 on the right side, the outline size of the connection portion 41 where the first recess 30_1 and the second recess 35 are connected on the left side is also larger than the outline size of the connection portion 41 where the first recessed 30_2 and the second recessed 35 are connected on the right side.

FIG. 17 is a view for illustrating how the precision of the opening size of the through-hole 25 on the first surface 20*a* side is lowered due to the pit 64*c* in the metal plate 64. At the place where a pit 64*c* having a large volume has been present, an etchant can enter the pit 64*c* at the start of the etching step. Therefore, at the place where the pit 64*c* has been present, the etching can progress in the thickness direction and the surface direction of the metal plate 64 more quickly than at the other position. Therefore, for example, when a pit 64*c* having a large volume is present near the end of the opening of the first resist pattern 65*a* or near the end of the opening of the second resist pattern 65*b* in the metal plate 64, the size of the through-hole 25 in the surface direction of the metal plate 64 can be increased at the portion where the pit 64*c* has been present. As a result, as indicated by a symbol 30_1 in FIG. 17, the size $r_3$ of the first recess 30 constituting the through-hole 25 on the first surface 20*a* can vary at the place where the pit 64*c* having a large volume has been present. In addition, a variation in the size $r_2$ of the through-portion 42 constituted by the connection portion 41 where the first recess 30 and the second recess 35 are connected may also occur. As a result, it is considered that the size precision and the positional precision of the deposition material to be adhered to the organic EL substrate 92 are lowered. Such a variation in the opening size may also occur for the second recess 35 on the second surface 20*b* side.

As described above, whether the through-holes 25 can be precisely formed in the metal plate 64 largely depends not only on the depth of the pit 64*c* formed on the surface of the metal plate 64 but also on the volume of the pit 64*c*. However, by conventional techniques based on arithmetic average roughness (Ra) or the like, the information on the volume of the pit 64*c* cannot be obtained. For this reason, when the metal plate 64 is inspected using the arithmetic average roughness (Ra), it is necessary to make the threshold for pass/fail determination more severe than necessary in order to prevent a metal plate 64 unsuitable for manufacturing the deposition mask 20 from passing the inspection. It is considered that this leads to reduction of the yield of the metal plate 64.

In order to solve such a problem, in the present embodiment, it is proposed that the inspection of the metal plate 64 be performed in consideration of the volume of the pit 64c. This enables a more accurate prediction for the degree of the reduction in the size precision of the through-holes 25 in the deposition mask 20 caused by the pits 64c. This enables the inspection of the metal plate 64 without making the threshold for pass/fail determination more severe than necessary, so that the yield of the metal plate 64 can be increased. Hereinafter, an exemplary inspection step in consideration of the volume of the pit 64c will be described with reference to FIG. 18 and FIG. 19.

Figure 18:
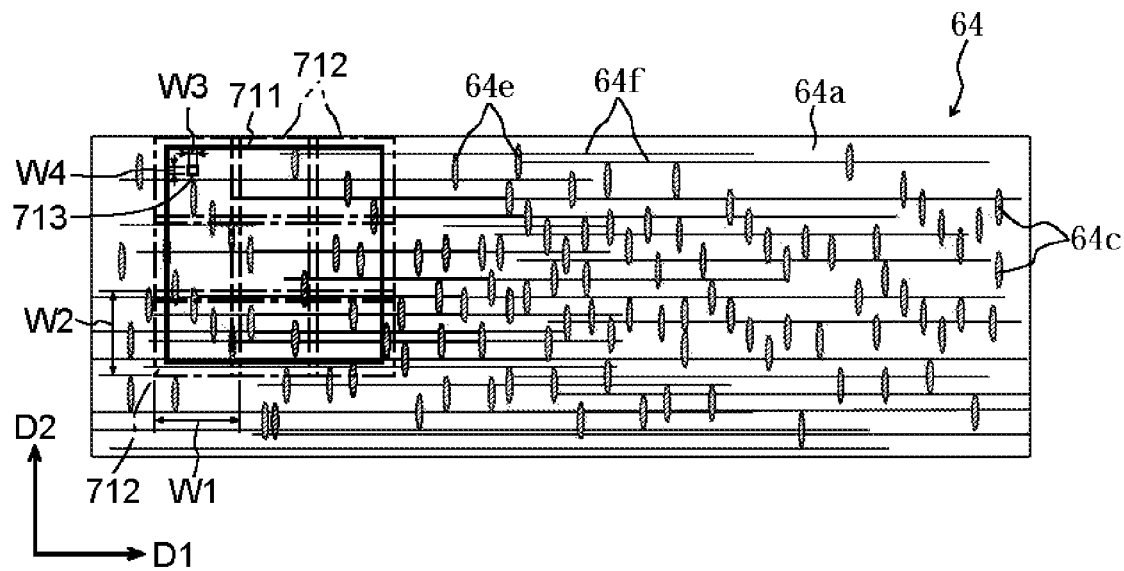
FIG. 18 is a plan view for illustrating the inspection step for the metal plate.
Figure 19:
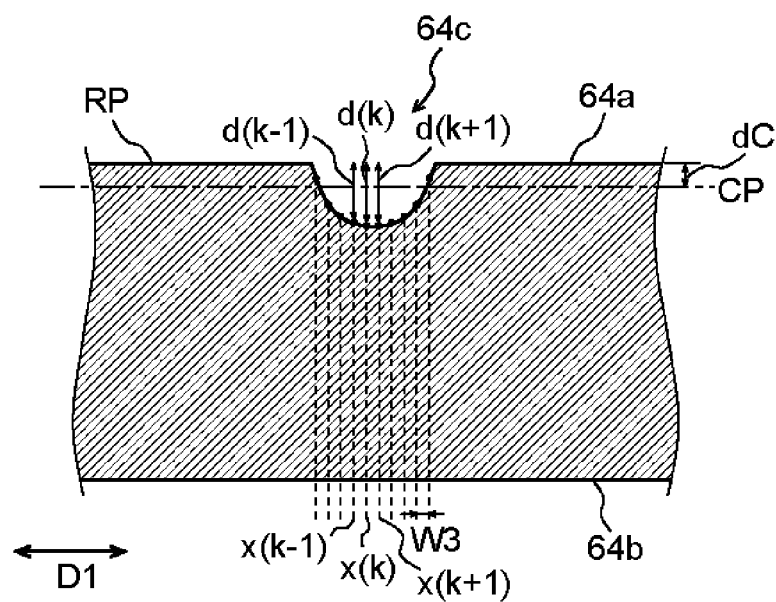
FIG. 19 is a sectional view for illustrating the inspection step for the metal plate.

FIG. 18 is an enlarged plan view showing a portion of the first surface 64a of the metal plate 64. A plurality of pits 64c are formed on the first surface 64a. In FIG. 19, the symbol D1 represents the transport direction of the metal plate 64 during the rolling step (hereinafter also referred to as the first direction). The symbol D2 represents the direction orthogonal to the first direction D1 (hereinafter also referred to as the second direction).

In the inspection step, the quality of the metal plate 64 is determined based on the volumes of the plurality of pits 64c located at the inspection area 711 of the first surface 64a shown in FIG. 18. The area U1 of the inspection area 711 is, for example, 0.1 mm$^2$ or more and 1.5 mm$^2$ or less. When the area U1 of the inspection area 711 is 0.1 mm$^2$ or more, variation of the inspection results depending on the position of the inspection area 711 can be reduced. When the area U1 of the inspection area 711 is 1.5 mm$^2$ or less, an excessive prolongation of the time required for the inspection can be prevented.

The inspection step includes a calculation step S1 and a determination step S2. The calculation step S1 is for calculating the corrected pit volume density. The corrected pit volume density is an index having a high correlation with the size precision of the components of the deposition mask 20, as supported in the Examples described later. In the determination step, the metal plate 64 is determined to be good when the corrected pit volume density is equal to or less than a predetermined threshold.

First, the calculation step S1 will be described. The calculation step S1 includes a measurement step S11 and a processing step S12. In the measurement step S11, first, as shown in FIG. 18, the plurality of unit area 712 are each photographed, and the depth of pits 64c is measured from the obtained image. The unit area 712 is, for example, a rectangular area having a side with a length W1 and a side with a length W2, as shown in FIG. 18. The unit area 712 corresponds to the range of an image that can be taken in one photographing. In the embodiment illustrated in FIG. 18, the side of the length W1 is parallel to the first direction D1, and the side of the length W2 is parallel to the second direction D2. For example, W1 is 270 μm, while W2 is 202 μm. Here, the expression "the side of the length W1 is parallel to the first direction D1" means that the angle defined by the side with a length W1 and the first direction D1 is in the range of −10° to +10°. Similarly, the expression "the side of the length W2 is parallel to the second direction D2" means that the angle defined by the side with a length W2 and the second direction D2 is in the range of −10° to +10°.

As shown in FIG. 18, two or more photographies are performed so that two adjacent unit areas 712 partially overlap in the first direction D1, and two adjacent unit areas 712 also partially overlap in the second direction D2. A plurality of thus-obtained images can be connected using an image connection software or the like to obtain an image of an area larger than one unit area 712. Thereafter, for example, an area indicated by symbol 711 in FIG. 18 is extracted as an inspection area from the image obtained by connection. For example, the inspection area 711 is defined to surround one unit area 712 located at the center among the nine unit areas 712 shown in FIG. 18 and to partially contain the eight unit areas 712 located around. An exemplary length of the inspection area 711 in the first direction D1 is 700 μm, and an exemplary length of the inspection area 711 in the second direction D2 is 500 μm.

In FIG. 18, the symbol 713 represents a pixel corresponding to the resolution of the inspection apparatus. One pixel 713 corresponds to, for example, one spot of a laser irradiated to the metal plate 64 by the inspection device. The length W3 in the first direction D1 and the length W4 in the second direction D2 of the pixel 713 are preferably 0.1 μm or more and 0.4 μm or less. The area U2 of the pixel 713 is preferably 0.01 μm$^2$ or more and 0.2 μm$^2$ or less. When the area of the unit area 712 is 270 μm×202 μm and the resolution in the first direction D1 and the second direction D2 of the unit region 712 is 1024×768, then the length W3 in the first direction D1 and the length W4 in the second direction D2 of the pixel 713 are both 0.263 μm. In addition, the area U2 of the pixel 713 is 0.069 μm$^2$.

FIG. 19 is a sectional view of a metal plate 64 on which pits 64c are formed, which is cut in parallel to the first direction D1. In FIG. 19, the symbol d(k) represents the distance from the first surface 64a to the bottom of the pit 64c at the pixel 713 located at the coordinate x(k) in the first direction D1. k is an integer, and the possible range of k is determined by the resolution of the image.

The first surface 64a of the metal plate 64 may have fine ruggedness or irregularities in addition to the distinct pit 64c as shown in FIG. 19. Thus, when the depth of the pit 64c is measured based on the first surface 64a, the measurement result for the depth of the pit 64c may vary depending on the state of the first surface 64a around the pit 64c. In consideration of such a problem, in the measurement step S11 and the processing step S12, the position of a reference plane RP which is a virtual plane may be adopted as the position of the first surface 64a in the thickness direction of the metal plate 64. Hereinafter, the reference plane RP will be described.

The reference plane RP of the first surface 64a is a plane estimated by, for example, least-squares method. Specifically, first, the position in the thickness direction of the inspection area 711 in the surface of the first surface 64a of the metal plate 64 is determined using a laser microscope described later. Subsequently, a given plane is temporarily set as the reference plane RP, and the square of the distance from the position of the surface of the first surface 64a to the reference plane RP is calculated in each pixel 713. In this case, a plane where the sum of each square of the distance is minimized can be adopted as the reference plane RP.

In the measurement step S11, as shown in FIG. 19, the depth d(k) of the pit 64c is measured for each pixel 713 in the inspection area 711. The measurement value of the depth is the distance value from the measurement value of the position in the thickness direction of the surface of the first surface 64a of the metal plate 64 to the reference plane RP estimated by the least-squares method.

As an inspection apparatus used in the measurement step S11, for example, a laser microscope can be used. In the measurement using a laser microscope, first, the inspection area 711 in the first surface 64a of the metal plate 64 is irradiated with a laser beam. Subsequently, the image of a laser beam reflected by the inspection area 711 is obtained as a two-dimensional reflection image of the inspection area 711 using, for example, a CCD or CMOS image sensor. In addition, the two-dimensional reflection image is analyzed based on the principle of confocal microscopy to measure the position of each pixel 713 in the inspection area 711 in the thickness direction of the surface of the first surface 64a of the metal plate 64. Example of the laser microscope which can be used include laser microscope VK-X200 series produced by Keyence Corporation.

In the processing step S12, information on the volume of the pit 64c in the inspection area 711 is calculated based on the depth of the pit 64c measured for each pixel 713 in the inspection area 711.

In the present embodiment, as shown in FIG. 19, a correction plane CP is first set, which is located on the second surface 64b side by a predetermined correction distance dC from the reference plane RP in the thickness direction of the metal plate 64. Subsequently, the sum of the volumes of parts of the pits 64c located at the inspection area 711 is calculated, wherein the parts are positioned on the second surface 64b side and the parts are the correction distance dC or more away from the reference plane RP in the thickness direction of the metal plate 64. For example, a value d(k)−dC is calculated by subtracting the correction distance dC from the depth d(k), for a part of the pit 64c located at the inspection area 711, the part having a depth greater than the correction distance dC. Then, the value d(k)−dC is multiplied by the area U2 of the pixel 713. Thus, the volume $V(k)$ ($=\{(d(k)-dC) \times U2\}$) of a part of the pit 64c, the part located on the second surface 64b side with respect to the correction plane CP, is calculated at each pixel 713. Finally, the volumes V(k) are integrated over the entire inspection area 711. Thus, the sum of the volumes of parts of the pits 64c located at the inspection area 711 (hereinafter referred to as corrected pit volume) V1 can be calculated, wherein the parts are positioned on the second surface 64b side with respect to the correction plane CP.

Subsequently, the corrected pit volume V1 is divided by the area U1 of the inspection area 711. Thus, the corrected pit volume per unit area (hereinafter also referred to as corrected pit volume density) V2 can be calculated.

The correction distance dC described above is preferably 0.1 μm or more and 0.5 μm or less, and is, for example, 0.2 μm. By appropriately setting the correction distance dC and calculating the corrected pit volume density V2, the correlation can be enhanced between the corrected pit volume density V2 and the size precision of the components of the deposition mask 20, as supported by the Examples described later. In the following description, the corrected pit volume V1 and the corrected pit volume density V2 obtained when the correction distance dC is set to be z μm may also referred to as the corrected pit volume V1 (z μm) and the corrected pit volume density V2 (z μm), respectively. For example, when the correction distance dC is 0.2 μm, expressions "corrected pit volume V1 (0.2 μm)" and "corrected pit volume density V2 (0.2 μm)" may be used.

Subsequently, a determination step S2 is performed where the metal plate 64 is determined to be good when the corrected pit volume density V2 is equal to or less than a predetermined threshold TH1. By the determination step S2, the metal plate 64 with which the components of the deposition mask 20 can be precisely formed, such as the through-hole 25, can be selected.

The threshold TH1 is appropriately determined based on, for example, the size precision required for the components of the deposition mask 20, and the setting of the correction distance dC. For example, when the error in the opening size of the through-hole 25 in the deposition mask 20, such as $r_3$ of the first recess 30 or the size r2 of the through-portion 42 described above, is required to be ±1.0 μm or less, and the correction distance dC is 0.2 μm, then the threshold TH1 can be set to be 15,000 $\mu m^3/mm^2$. The threshold TH1 may be 12,000 $\mu m^3/mm^2$, 10,000 $\mu m^3/mm^2$, 9,000 $\mu m^3/mm^2$, 6,000 $\mu m^3/mm^2$, 5,000 $\mu m^3/mm^2$, 3,000 $\mu m^3/mm^2$, or 1,000 $\mu m^3/mm^2$.

When the corrected pit volume density V2 is equal to or more than the threshold TH2 and equal to or less than the threshold TH1, the determination step S2 may determine the metal plate 64 as good. Thus, the determination step S2 may employ not only the threshold TH1 defining the upper limit of the corrected pit volume density V2, but also the threshold TH2 defining the lower limit of the corrected pit volume density V2. When the metal plate 64 has a corrected pit volume density V2 that is equal to or more than the threshold TH2, the adherence of the resist film to the surface of the metal plate 64 can be increased. The upper threshold TH1 may be referred to as the first threshold, while the lower threshold TH2 may be referred to as the second threshold. The threshold TH2 may be 10 $\mu m^3/mm^2$, 100 $\mu m^3/mm^2$, 500 $\mu m^3/mm^2$, 1,000 $\mu m^3/mm^2$, 3,000 $\mu m^3/mm^2$, 4,000 $\mu m^3/mm^2$, or 5,000 $\mu m^3/mm^2$.

The range of the corrected pit volume density V2 of the metal plate 64 determined as good in the determination step S2 may be defined by a combination of any one of the upper threshold TH1 candidates described above and any one of the lower threshold TH2 candidates described above. For example, the corrected pit volume density V2 of the metal plate 64 determined as good, i.e., the selected metal plate 64 may be 10 $\mu m^3/mm^2$ or more and 15,000 $\mu m^3/mm^2$ or less, 100 $\mu m^3/mm^2$ or more and 12,000 $\mu m^3/mm^2$ or less, 500 $\mu m^3/mm^2$ or more and 10,000 $\mu m^3/mm^2$ or less, 1,000 $\mu m^3/mm^2$ or more and 9,000 $\mu m^3/mm^2$ or less, 3,000 $\mu m^3/mm^2$ or more and 6,000 $\mu m^3/mm^2$ or less, and 4,000 $\mu m^3/mm^2$ or more and 6,000 $\mu m^3/mm^2$ or less. The range of the corrected pit volume density V2 of the selected metal plate 64 may be defined by a combination of any two of the upper threshold TH1 candidates described above. For example, the corrected pit volume density V2 of the selected metal plate 64 may be 12,000 $\mu m^3/mm^2$ or more and 15,000 $\mu m^3/mm^2$ or less. The range of the corrected pit volume density V2 of the selected metal plate 64 may be defined by a combination of any two of the lower threshold TH2 candidates described above. For example, the corrected pit volume density V2 of the selected metal plate 64 may be 10 $\mu m^3/mm^2$ or more and 100 $\mu m^3/mm^2$ or less.

Figure 39:
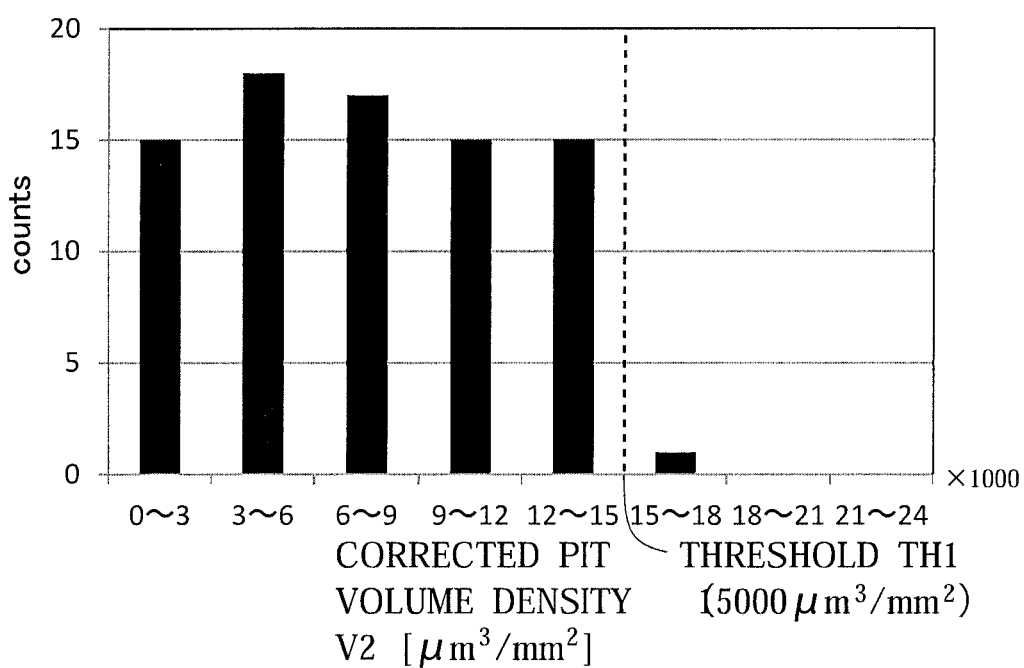
FIG. 39 is a view of showing an exemplary distribution of the corrected pit volume density of a plurality of selected metal plates.

FIG. 39 is a graph showing an example of the distribution of the corrected pit volume densities V2 of a plurality of metal plates 64 selected based on a determination condition where the metal plate having a corrected pit volume density V2 equal to or less than the threshold TH1 is determined as good. In FIG. 39, the horizontal axis represents the value of the corrected pit volume density V2 calculated for each metal plate 64. The vertical axis represents the number of metal plates 64 having a corrected pit volume density V2 in the range represented by the horizontal axis. For example, the number of the metal plates 64 having a corrected pit volume density V2 of 6,000 $\mu m^3/mm^2$ or more and less than 9,000 $\mu m^3/mm^2$ among the plurality of selected metal plates 64 is 17.

In the embodiment shown in FIG. 39, the threshold TH1 is 15,000 μm³/mm². In this case, most, e.g., 95% or more, of the metal plates 64 determined as good have a corrected pit volume density V2 of 15,000 μm³/mm² or less. As shown in FIG. 39, a part of the selected metal plates 64 may have a corrected pit volume density V2 exceeding 15,000 μm³/mm² due to a measurement error or the like.

Figure 40:
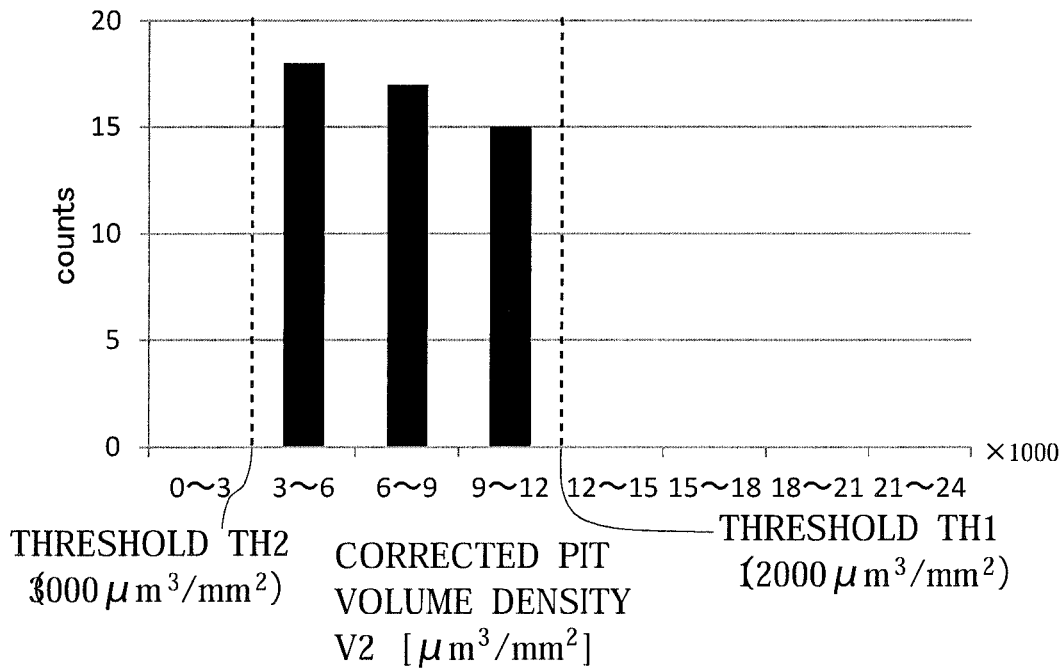
FIG. 40 is a view of showing an exemplary distribution of the corrected pit volume density of a plurality of selected metal plates.

FIG. 40 shows an example of the distribution of the corrected pit volume density V2 of a plurality of metal plates 64 selected based on a determination condition where the metal plate having a corrected pit volume density V2 of equal to or more than the threshold TH2 and equal to or less than the threshold TH1 as good. The meanings of the horizontal and vertical axes shown in FIG. 40 are the same as in FIG. 39. In the example in FIG. 40, the threshold TH2 is 3,000 μm³/mm², and the threshold TH1 is 15,000 μm³/mm². Thus, in the example in FIG. 40, the range of the metal plates 64 selected as good products is narrower than that of the example in FIG. 39. In this case, the performance of selection as shown in FIG. 40 also include the performance of selection as shown in FIG. 39.

In the above description, an embodiment has been shown in which an inspection step of inspecting the metal plate 64 based on the corrected pit volume density V2 is used to determine the quality of the metal plate 64, or to select the metal plate 64. In other words, an embodiment has been shown in which the inspection step functions as a selection step of selecting the metal plate 64 in the manufacturing method for the metal plate 64. However, the inspection step may be used for purposes other than selection of the metal plate 64 in the manufacturing method of the metal plate 64.

Any selection conditions may be used in the selection step. For example, in the selection step, a metal plate 64 may be selected, which has a corrected pit volume density V2 belonging within a range defined by a combination of any one of the upper threshold TH1 candidates described above and any one of the lower threshold TH2 candidates described above. Alternatively, in the selection step, a metal plate 64 may be selected, which has a corrected pit volume density V2 belonging within a range defined by a combination of any two of the upper threshold TH1 candidates described above. Alternatively, in the selection step, a metal plate 64 may be selected, which has a corrected pit volume density V2 belonging within a range defined by a combination of any two of the lower threshold TH2 candidates described above.

In some embodiment described below, the inspection step is used for the purpose other than selection of the metal plate 64 in the manufacturing method for the metal plate 64. For example, the inspection step may be used for optimizing the conditions for manufacturing the metal plate 64, such as reduction ratio and oil usage. Specifically, the inspection step may be used for operations of manufacturing the metal plates 64 with various reduction ratios and oil usages, calculating the corrected pit volume density V2 from each of the obtained metal plates 64, and determining an appropriate manufacturing conditions capable of lowering the corrected pit volume density V2. In this case, it is not necessary that the selection based on the inspection step is performed for all the metal plates 64 obtained during the manufacturing process for the metal plate 64. For example, the inspection step may be performed only for some of the metal plates 64. Alternatively, after a manufacturing condition has been once set, the inspection step may not be performed at all.

Figure 41:
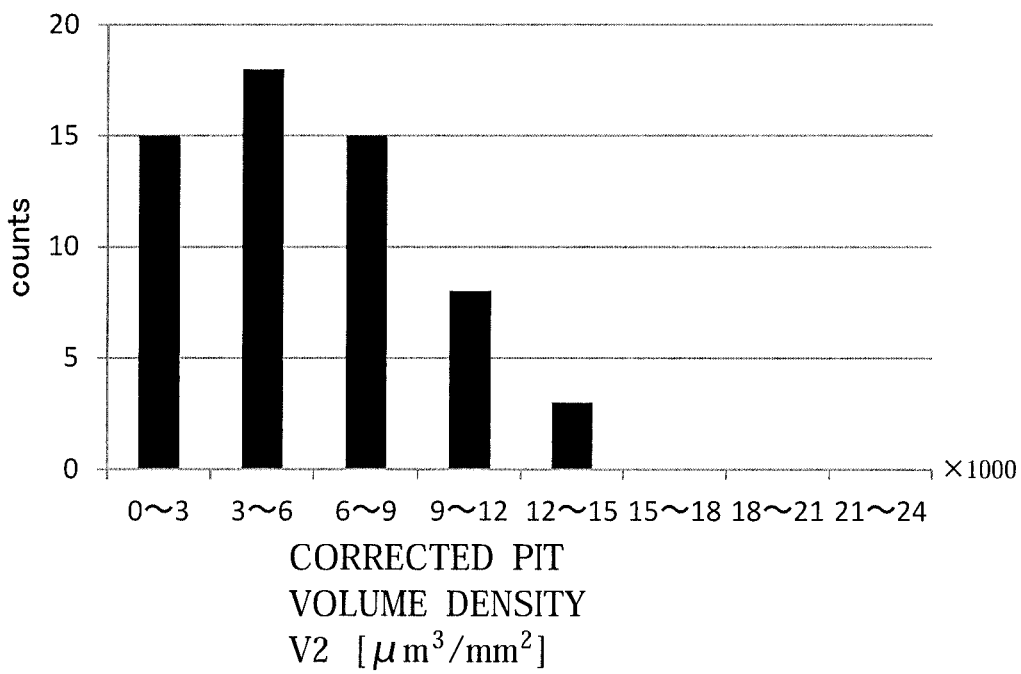
FIG. 41 is a view of showing an exemplary distribution of the corrected pit volume density of a plurality of manufactured metal plates.

FIG. 41 is a graph showing an example of the distribution of the corrected pit volume densities V2 of a plurality of metal plates 64 manufactured based on manufacturing conditions found by using a determination condition where the metal plate having a corrected pit volume density V2 equal to or less than the threshold TH1 is determined as good. The meanings of the horizontal and vertical axes shown in FIG. 41 are the same as in FIG. 39. In the embodiment in FIG. 41, the threshold TH1 is 15,000 μm³/mm². In the embodiment in FIG. 41, even in the case where the selection step is not performed, the plurality of manufactured metal plates 64 have a corrected pit volume density V2 of 15,000 μm³/mm² or less.

According to the manufacturing method for a metal plate according to the present embodiment, a metal plate 64 having a corrected pit volume density V2 that satisfies the determination condition described above can be obtained. For example, a metal plate 64 having the corrected pit volume density V2 of 15000 μm³/mm² or less can be obtained. This can prevent the size precision of the through-hole 25 of the deposition mask 20 from being lowered due to pits 64c. As a result, the size precision and positional precision of the deposition material to be adhered to the organic EL substrate 92 through the through-hole 25 can be improved.

Figure 20:
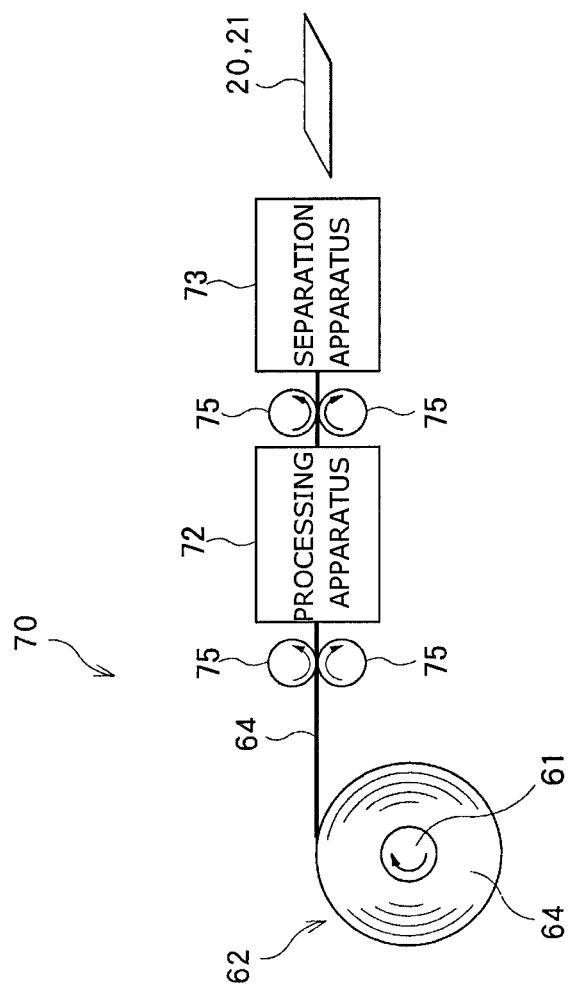
FIG. 20 is a schematic view for generally explaining one embodiment of a manufacturing method for a deposition mask.

Next, a method for manufacturing the deposition mask 20 by using the metal plate 64 that has passed the inspection step described above is described with reference mainly to FIG. 20 to FIG. 28. FIG. 20 is a view illustrating a manufacturing apparatus 70 for manufacturing the deposition mask 20 using the metal plate 64. A winding body 62 is first prepared by winding the metal plate 64 around a core 61. Subsequently, the winding body 62 is unwound by rotating the core 61 to supply the metal plate 64 extending like a strip as shown in FIG. 20.

The supplied metal plate 64 is transported sequentially to a processing apparatus 72 and a separation apparatus 73 by the transport roller 75. The processing apparatus 72 performs a processing step of processing the metal plate 64 that has passed the inspection step to form a through-hole 25 in the metal plate 64. In the present embodiment, a large number of through-holes 25 corresponding to a plurality of deposition masks 20 are formed in the metal plate 64. In other words, a plurality of deposition masks 20 are assigned to the metal plate 64. The separation apparatus 73 performs a separation step of separating a portion of the metal plate 64 in which a plurality of through-holes 25 corresponding to one deposition mask 20 are formed from the metal plate 64. Thus, a sheet-shaped deposition mask 20 can be obtained.

The processing step will be described with reference to FIG. 20 to FIG. 28. The processing step includes a step of etching an elongated metal plate 64 using a photolithographic technique to form a first recess 30 in the metal plate 64 from the first surface 64a side, and a step of etching the metal plate 64 using a photolithographic technique to form a second recess 35 in the metal plate 64 from the second surface 64b side. Then, the first recess 30 and the second recess 35 formed in the metal plate 64 are communicated with each other to form a through-hole 25 in the metal plate 64. In the embodiment described below, the step of forming the first recess 30 is performed before the step of forming the second recess 35, and a further step of sealing the prepared first recess 30 is performed between the steps of forming the first recess 30 and the second recess 35. Details of the respective steps are described below.

Figure 21:
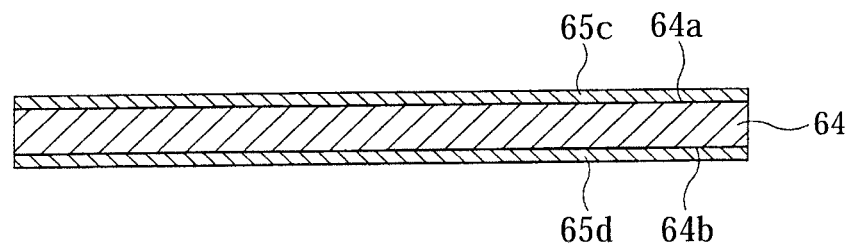
FIG. 21 is a view showing a step of forming resist films on the metal plate.

As shown in FIG. 21, resist films 65c and 65d each containing a negative photosensitive resist material are first formed on the first surface 64a and the second surface 64b, respectively, of the metal plate 64. For example, the resist films 65c and 65d are formed by applying a coating liquid containing a photosensitive resist material such as casein on the first surface 64a and the second surface 64b, respectively, of the metal plate 64, and then drying the coating liquid. Alternatively, the resist films 65c and 65d may be formed by applying a dry film on the first surface 64a and the second surface 64b of the metal plate 64. The dry film contains, for example, an acryl photocurable resin.

Figure 22:
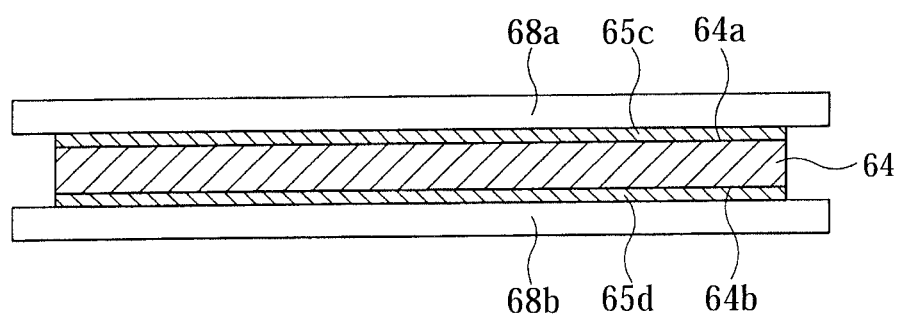
FIG. 22 is a view showing a step of bringing exposure masks into tight contact with the resist films.

Then, exposure masks 68a and 68b which do not allow light to transmit through areas to be removed of the resist films 65c and 65d are prepared. Thereafter, the exposure masks 68a and 68b are arranged on the resist films 65c and 65d, respectively, as shown in FIG. 22. During this, an alignment step of adjusting the relative positional relationship between the exposure mask 68a on the first surface 64a side and the exposure mask 68b on the second surface 64b side may be performed. As the exposure masks 68a and 68b, for example, glass dry plates which do not allow light to transmit through the areas to be removed from the resist films 65c and 65d are used. Thereafter, the exposure masks 68a and 68b are sufficiently brought into tight contact with the resist films 65c and 65d by vacuum bonding.

A positive photosensitive resist material may be used. In this case, as the exposure mask, one which allows light to transmit through an area to be removed of the resist film is used.

Figure 23:
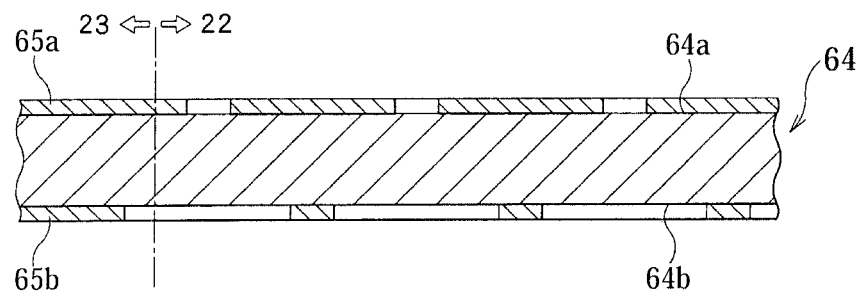
FIG. 23 is a view of showing a step of developing the resist films.

After that, the resist films 65c and 65d are exposed through the exposure masks 68a and 68b (exposure step). Further, the resist films 65c and 65d are developed in order to form an image on the exposed resist films 65c and 65d (development step). Thus, as shown in FIG. 23, a first resist pattern 65a can be formed on the first surface 64a of the metal plate 64, and a second resist pattern 65b can be formed on the second surface 64b of the metal plate 64. The development step may include a resist heating step for increasing the hardnesses of the resist films 65c and 65d, or for bringing the resist films 65c and 65d to the metal film 64 more strongly. The resist heating step may be performed at, for example, room temperature or higher and 400° C. or lower.

Figure 24:
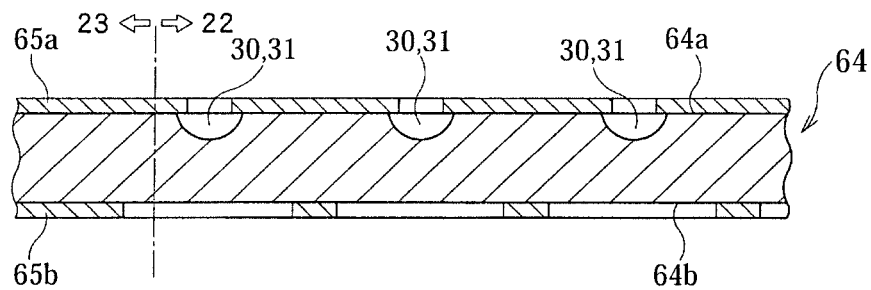
FIG. 24 is a view of showing a step of etching the first surface.

Then, as shown in FIG. 24, a first surface etching step of etching an area of the first surface 64a of the metal plate 64 using a first etchant, which the area is not covered with the first resist pattern 65a, is performed. For example, the first etchant is ejected from a nozzle disposed on the side facing the first surface 64a of the transported metal plate 64, toward the first surface 64a of the metal plate 64 through the first resist pattern 65a. As a result, as shown in FIG. 24, areas of the metal plate 64, which are not covered with the first resist pattern 65a, are eroded by the first etchant. Thus, a large number of first recesses 30 are formed in the first surface 64a of the metal plate 64. The first etchant to be used is, for example, an etchant containing a ferric chloride solution and hydrochloric acid.

Figure 25:
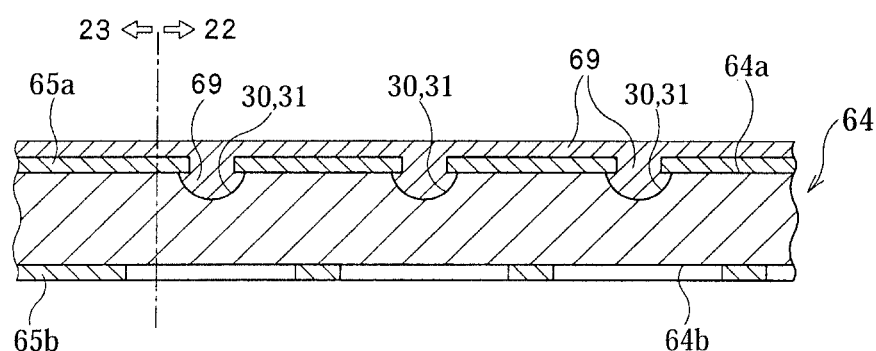
FIG. 25 is a view of showing a step of coating the first recesses with a resin.

After that, as shown in FIG. 25, the first recess 30 is coated with a resin 69 resistant to a second etchant that is used in a subsequent second surface etching step. Namely, the first recess 30 is sealed by the resin 69 resistant to a second etchant. In the embodiment illustrated in FIG. 25, a film of the resin 69 is formed to cover not only the formed first recess 30 but also the first surface 64a (first resist pattern 65a).

Figure 26:
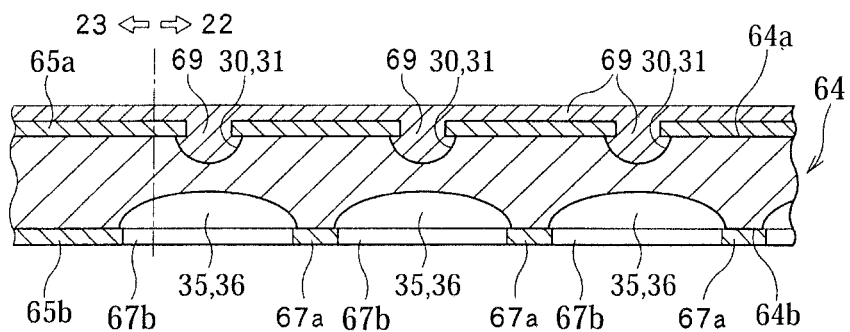
FIG. 26 is a view of showing a step of etching the second surface.

Then, as shown in FIG. 26, a second surface etching step of etching an area of the second surface 64b of the metal plate 64, which the area is not covered with the second resist pattern 65b, to form a second recess 35 in the second surface 64b, is performed. The second surface etching step is performed until the first recess 30 and the second recess 35 communicate with each other to form a through-hole 25. Similarly to the first etchant described above, the second etchant to be used is, for example, an etchant containing a ferric chloride solution and hydrochloric acid.

Figure 27:
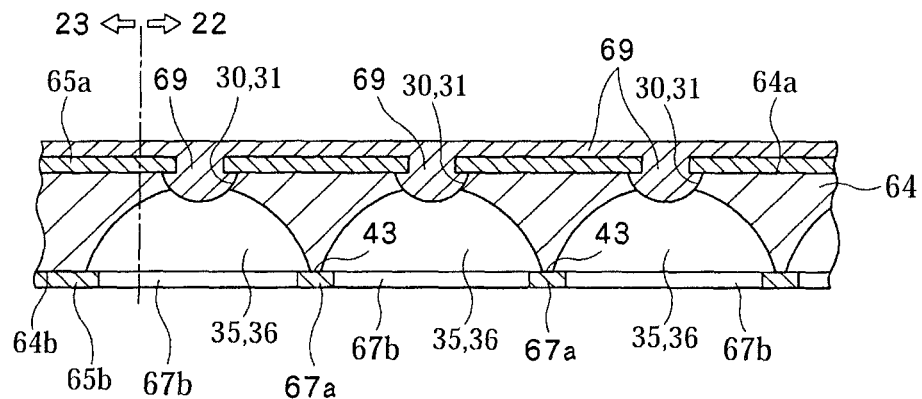
FIG. 27 is a view of showing a step of etching the second surface subsequent to FIG. 26.

The erosion by the second etchant takes place in a portion of the metal plate 64, which is in contact with the second etchant. Thus, the erosion develops not only in the normal direction N (thickness direction) of the metal plate 64 but also in the direction along the plate plane of the metal plate 64. Preferably, the second surface etching step is finished before the two second recesses 35 each formed at a position facing two adjacent holes 67b of the second resist pattern 65b, are merged on the reverse side of the bridge portion 67a positioned between the two holes 67b. Thus, as shown in FIG. 27, the top portion 43 described above can be left on the second surface 64b of the metal plate 64.

Figure 28:
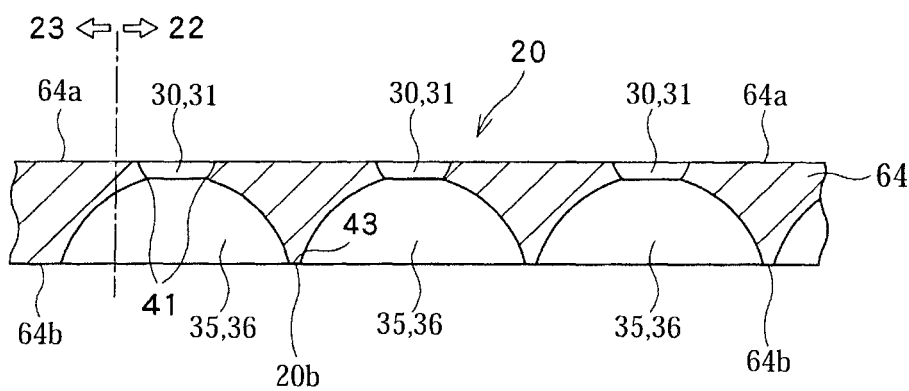
FIG. 28 is a view of showing a step of removing the resin and the resist pattern from the metal plate.

After that, as shown in FIG. 28, the resin 69 is removed from the metal plate 64. For example, the resin 69 can be removed by using an alkali-based peeling liquid. When the alkali-based peeling liquid is used, as shown in FIG. 28, the resist patterns 65a and 65b are removed simultaneously with the removal of the resin 69. Alternatively, after the removal of the resin 69, the resist patterns 65a and 65b may be removed separately from the resin 69 using a peeling liquid other than the peeling liquid used for peeling the resin 69.

Then, a portion of the metal plate 64 in which a plurality of through-holes 25 corresponding to one deposition mask 20 are formed is separated from the metal plate 64 to obtain a deposition mask 20.

Next, a method for manufacturing the deposition mask apparatus 10 by combining the deposition mask 20 and the frame 15 will be described. First, the frame 15 is prepared. Next, the second surface 20b of the deposition mask 20 is fixed to the frame 15 by welding or the like. Specifically, the deposition mask 20 is first photographed from the first surface 20a side using a camera or the like, in a state where the frame 15 and the deposition mask 20 are stacked. During this, the deposition mask 20 may be applied with a tension. Next, the position of the deposition mask 20 relative to the frame 15 is detected based on the image obtained by the photographing. For example, detection is performed for the position of the outline of the deposition mask 20 in the longitudinal direction D1. Then, the position of the deposition mask 20 is adjusted so that the position of the deposition mask 20 is at the predetermined position relative to the frame 15.

Next, a deposition method for depositing a deposition material 98 onto a substrate such as an organic EL substrate 92 by using the deposition mask 20 will be explained. First, the deposition mask apparatus 10 is arranged so that the deposition mask 20 faces the organic EL substrate 92. Further, a magnet 93 is used to bring the deposition mask 20 into tight contact with the organic EL substrate 92. The deposition material 98 can be evaporated and allowed to fly to the organic EL substrate 92 through the deposition mask 20 in this state to allow the deposition material 98 to adhere to the organic EL substrate 92 in a pattern corresponding to the through-holes 25 in the deposition mask 20.

In the manufacturing method for the deposition mask 20 according to the present embodiment, a metal plate 64 that has passed the inspection step performed based on the sum of the volumes of the pits 64c formed in the surface of the metal plate 64 is used to manufacture a deposition mask 20. This can prevent the size precision of the through-hole 25 of the deposition mask 20 from being lowered due to the pits 64c. As a result, the size precision and positional precision of the deposition material to be adhered to the organic EL substrate 92 through the through-hole 25 can be improved.

It is noted that various modifications can be made to the embodiment described above. Hereinafter, the modifications will be described with reference to the drawings as necessary. In the below description and the drawings used in the below description, a part that can be similarly constituted to the above embodiments shall have the same symbol as that of the corresponding part of the above embodiment, and overlapped description is omitted. In addition, when it is clear that the effects obtained by the above-described embodiments are obtained in the modifications, description thereof may be omitted.

In the embodiments illustrated above, the inspection target in the inspection step is the first surface 64a where the first recess 30 is formed, among the surfaces of the metal plate 64. However, the present invention is not limited to this, and the inspection target in the inspection step may be the second surface 64b where the second recess 35 is formed, among the surfaces of the metal plate 64. Alternatively, both the first surface 64a and the second surface 64b of the metal plate 64 may be the inspection targets.

In the embodiments illustrated above, the inspection step for the metal plate 64 is performed with the other equipment than that for performing the manufacturing method for the deposition mask 20, such as above-described processing step and separation step. In other words, embodiments where the inspection step for the metal plate 64 is a step of the manufacturing method for the metal plate 64 have been illustrated. However, the present invention is not limited to this, and the inspection step for the metal plate 64 may be performed with the equipment for performing the manufacturing method for the deposition mask 20. In other words, the inspection step for the metal plate 64 is a step of the manufacturing method for the deposition mask 20.

In the embodiments illustrated above, the surface of the metal plate 64 before formation of the through-hole 25 has a corrected pit volume density of 15,000 $\mu m^3/mm^2$ or less. Similarly, the surface of the metal plate 64 after formation of the through-hole 25, or of the metal plate 21 for the deposition mask 20, may also have a corrected pit volume density of 15,000 $\mu m^3/mm^2$ or less. As described above, the portion of the metal plate 64 where the through-hole 25 is not to be formed is covered with a resist pattern during the etching step. Thus, in the portions of the metal plate 21 for the deposition mask 20, which locate at the ear portions 17a and 17b and the peripheral area 23, pits 64c comparable to those present in the metal plate 64 before formation of the through-hole 25 may exist. Therefore, a portion of the ear portions 17a and 17b or the peripheral area 23 of the surface of the metal plate 21 for the deposition mask 20 can be set as the inspection area, and the above-mentioned inspection step considering the volume of the pit 64c can be performed to calculate the corrected pit volume density of the surface of the metal plate 21 for of the deposition mask 20.

EXAMPLES

Next, embodiments of the present disclosure will be described in more detail based on examples. The embodiments of the present disclosure are not limited to the description of the examples below unless they depart from the spirit and scope of the present disclosure.

First Inspection Example

First, a base metal composed of an iron alloy containing 36% by mass of nickel, the balance of iron, and unavoidable impurities was prepared. Then, the base metal was subjected to the rolling step, the slitting step and the annealing step described above to produce two winding bodies (also referred to as "first sample" and "second sample") comprising a wound elongated metal plate having a thickness of 15 µm. In a similar manner, seven winding bodies (also referred to as "third sample" to "tenth sample") comprising a wound elongated metal plate having a thickness of 20 µm were produced.

Thereafter, the above-mentioned inspection step of inspecting the irregularities in the surface of each sample was performed. First, the sample was cut out at the middle of the sample in the width direction to prepare a square test piece having sides of 5 cm. Then, the measurement step of measuring the position of the surface at each pixel 713 in an inspection area 711 of the test piece was performed using a laser microscope. The laser microscope used was a laser microscope VK-X200 series produced by Keyence Corporation.

When the position of the surface of the test piece was measured, the settings of the laser microscope were as follows:

Laser beam: Blue (wavelength: 408 nm)
Objective lens: 50×
Optical zoom: 1.0×
Measurement mode: Surface shape
Measurement size: Standard (1024×768)
Measurement quality: High speed
RPD: YES
Fixing method of test piece: put on a KOKUYO magnet sheet.

The abbreviation "RPD" means "Real Peak Detection." The expression "RPD YES" means that a technique of measuring the position of the surface of the test piece by detecting the peak of the reflected light of the laser beam.

The area of the inspection area 711 will be described. For the first to fourth and seventh to tenth samples, the inspection area 711 was obtained by joining nine areas (images) measured under the above-described setting "Standard (1024×768)." In this case, the area U1 of the inspection area 711 was 0.35 $mm^2$. For the fifth and sixth samples, the inspection area 711 was obtained by joining four areas (images) measured under the above-described setting "Standard (1024×768)." In this case, the area U1 of the inspection area 711 was 0.175 $mm^2$.

Next, the processing step of calculating the corrected pit volume V1 and the corrected pit volume density V2 of the surface of the test piece was performed based on the measurement results. First, the above-described reference plane RP was calculated according to the least-squares method using the function [reference plane setting] of the laser microscope. At this time, the entire area was targeted without specifying an area. The other settings of the laser microscope are as follows:

[Surface Shape Correction] YES, Correction method: Waviness removal, Correction strength: 5
[Smoothing] Size: 3×3, Type: Simple average
[Height Cut Level] Middle Next, the corrected pit volume V1 and the corrected pit volume density V2 of each test piece were calculated based on the measurement results of the positions of the surface of the test piece obtained from the sample and the calculation result of the reference plane RP. At this time, the correction distance dC between the reference plane RP and the correction plane CP was set as 0.2 µm. The calculation results of the corrected pit volume density V2 are shown in FIG. 29.

Figure 30:
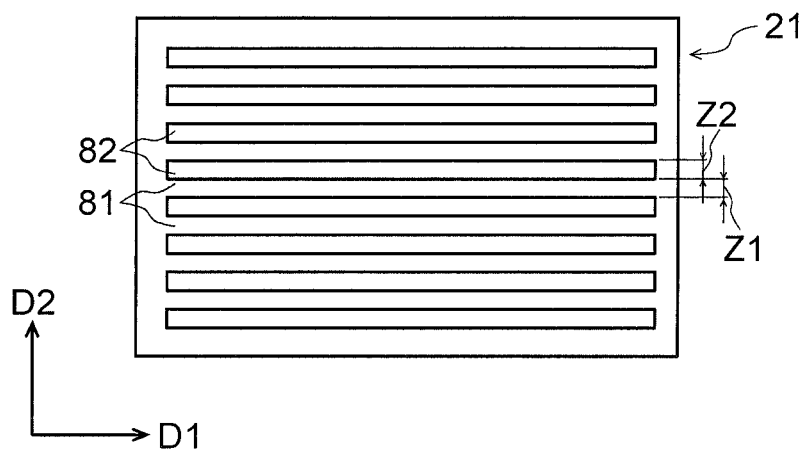
FIG. 30 is a plan view showing an exemplary pattern of recessed portions and rib portions formed in each metal plate.
Figure 31:
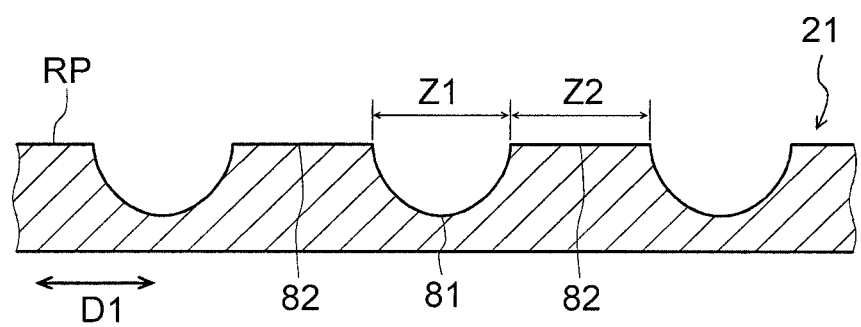
FIG. 31 is a sectional view of the metal plate shown in FIG. 30.

Next, after the sheet-shaped metal plate 21 cut out from each of the samples described above was etched to form a pattern of recessed portions and rib portions in each metal plate 21, the size precision of the pattern was evaluated. FIG. 30 is a plan view showing an exemplary pattern of recessed portions 81 and rib portions 82 formed in each metal plate 21. FIG. 31 is a sectional view of the metal plate 21 shown in FIG. 30. In the embodiment illustrated in FIG. 30 and FIG. 31, the metal plate 21 was etched to form the recessed portions 81, such that the rib portions 82 extending along the first direction D1 remains in the metal plate 21. The designed values of the size Z1 of the recessed portion 81 and the size Z2 of the rib portion 82 in the direction (here, the width direction D2) orthogonal to the direction in which the rib portion 82 extends (here, the rolling direction D1) were 30 μm.

Next, the width of the rib portion 82 formed in each metal plate 21 was measured using a laser microscope. Specifically, the width of the rib portion 82 was measured at a total of 25 points at intervals of 2 μm along the direction in which the rib portion 82 extends (here, the first direction D1). Further, a value obtained by multiplying the standard deviation of the measurement results of the width of the rib portion 82 at 25 points (hereinafter also referred to as 3σ (D1)) was calculated. The value of 3σ (D1) for the metal plate 21 cut out from each sample is also shown in FIG. 29.

The laser microscope used was a laser microscope including a measurement unit and a control unit, produced by Keyence Corporation. The model number of the measurement unit is VK-X 160, while the model number of the control unit is VK-X 150.

When the width of the rib portion 82 was measured, the settings of the laser microscope were as follows:
Brightness: 7140
Measurement mode: Surface shape
Measurement size: High definition (2048×1536)
Measurement quality: High precision
APERTURE SHUTTER: open
LASER SUTTER: open
Objective lens: 100×
Optical zoom: 1.0×
Measurement: Reflection measurement
Repeat accuracy of width measurement: 3σ=0.03 μm.

Figure 32:
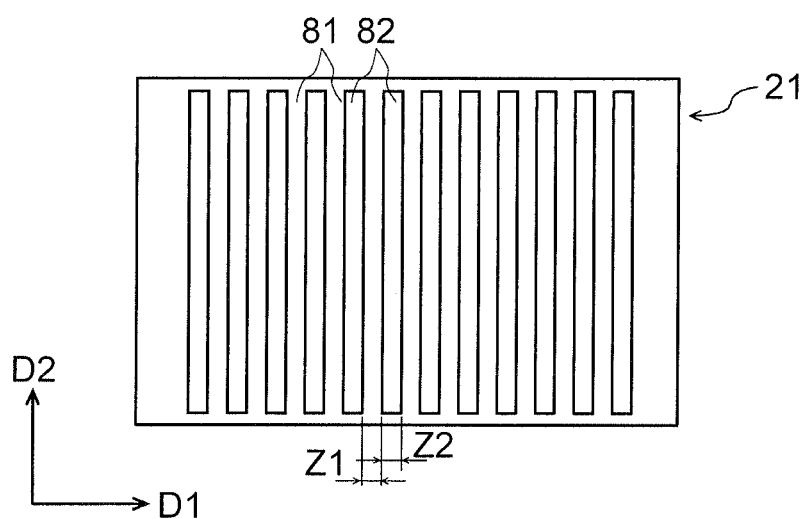
FIG. 32 is a plan view showing the other exemplary pattern of recessed portions and rib portions formed in each metal plate.

Next, the sheet-shaped metal plate 21 cut out from each of the samples described above was etched in a pattern different from the embodiment shown in FIG. 30 to form a pattern of recessed portions 81 and rib portions 82 in each metal plate 21. Specifically, as shown in FIG. 32, the metal plate 21 was etched to form the recessed portions 81, such that the rib portions 82 extending along the second direction D2 remains in the metal plate 21. Next, the width of the rib portion 82 formed in each metal plate 21 was measured using a laser microscope. Specifically, the width of the rib portion 82 was measured at a total of 25 points at intervals of 2 μm along the direction in which the rib portion 82 extends (here, the second direction D2). Further, a value obtained by multiplying the standard deviation of the measurement results of the width of the rib portion 82 at 25 points (hereinafter also referred to as 3σ (D2)) was calculated. The value of 3σ (D2) for the metal plate 21 cut out from each sample is also shown in FIG. 29.

In addition, for the metal plate 21 cut out from each sample, the average 3σ (ave) of the above 3σ (D1) and 3σ (D2) was calculated. The value of 3σ (ave) of the metal plate 21 cut out from each sample is also shown in FIG. 29 above.

Figure 33:
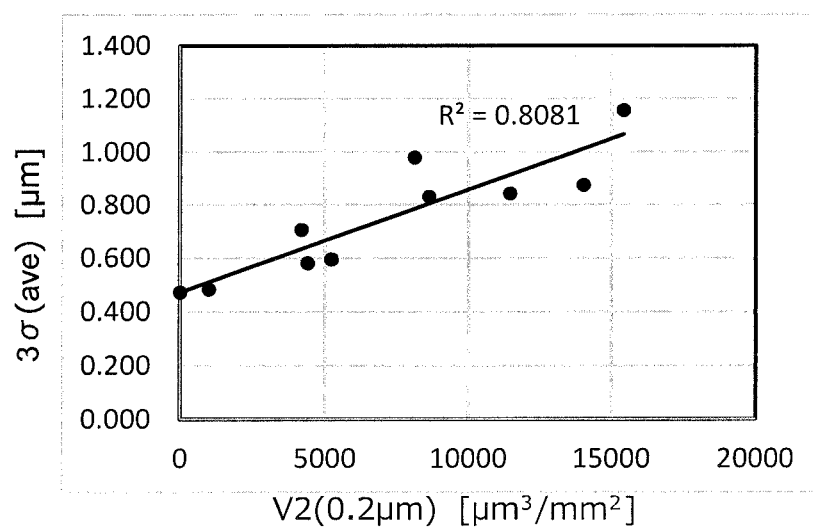
FIG. 33 is a scatter diagram showing the correlation between the indices obtained by the first inspection example and the size precision of rib portions formed in each sample.

Next, the correlation coefficient $R^2$ between the corrected pit volume density V2 (0.2 μm) and 3σ (ave) from the width of the rib portion 82, which were calculated for each sample, was determined. The resulting correlation coefficient $R^2$ was 0.8081. FIG. 33 is a scatter diagram showing the correlation between the corrected pit volume density V2 (0.2 μm) and 3σ (ave) from the width of the rib portion 82.

Second to Fifth Inspection Examples

Figures 34, 35:
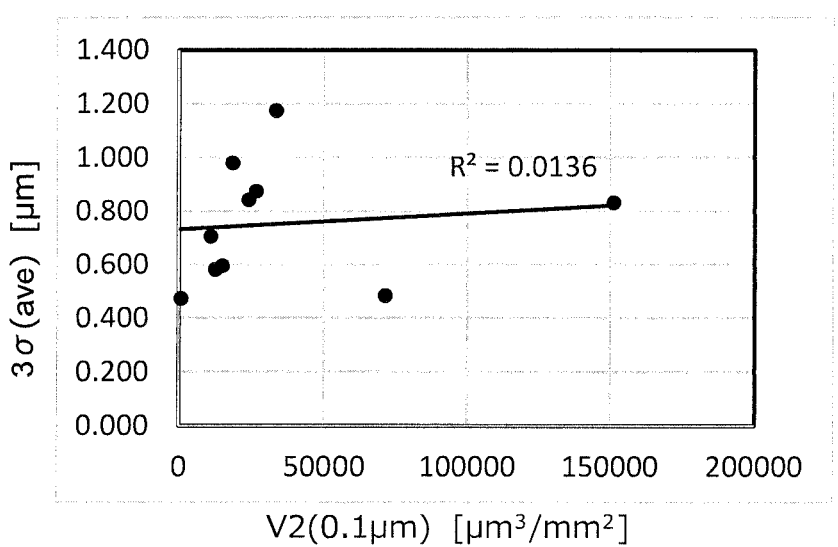
FIG. 34 is a table showing the inspection results for the state of pits in the surface of each metal plate sample according to the second to fifth inspection examples.
FIG. 35 is a scatter diagram showing the correlation between the indices obtained by the second inspection example and the size precision of rib portions formed in each sample.

The irregularities of the surface of the first to tenth samples described above was inspected based on the corrected pit volume density V2 in the same manner as in the first inspection example described above except that the correction distance dC between the reference plane RP and the correction plane CP was changed. Specifically, in the second inspection example, the corrected pit volume density V2 (0.1 μm) was calculated with the correction distance dC set as 0.1 μm. In the third inspection example, the corrected pit volume density V2 (0.3 μm) was calculated with the correction distance dC set as 0.3 μm. In the fourth inspection example, the corrected pit volume density V2 (0.4 μm) was calculated with the correction distance dC set as 0.4 μm. In the fifth inspection example, the corrected pit volume density V2 (0.5 μm) was calculated with the correction distance dC set as 0.5 μm. The calculation results of the corrected pit volume densities V2 (0.1 μm), V2 (0.3 μm), V2 (0.4 μm), and V2 (0.5 μm) for each of the samples are also shown in FIG. 34 in addition to the corrected pit volume density V2 (0.2 μm) described above.

Next, the correlation coefficient $R^2$ between the corrected pit volume density V2 (0.1 μm) and 3σ (ave) from the width of the rib portion 82, which were calculated for each sample, was determined. The resulting correlation coefficient $R^2$ was 0.0136. FIG. 35 is a scatter diagram showing the correlation between the corrected pit volume density V2 (0.1 μm) and 3σ (ave) from the width of the rib portion 82.

Figure 36:
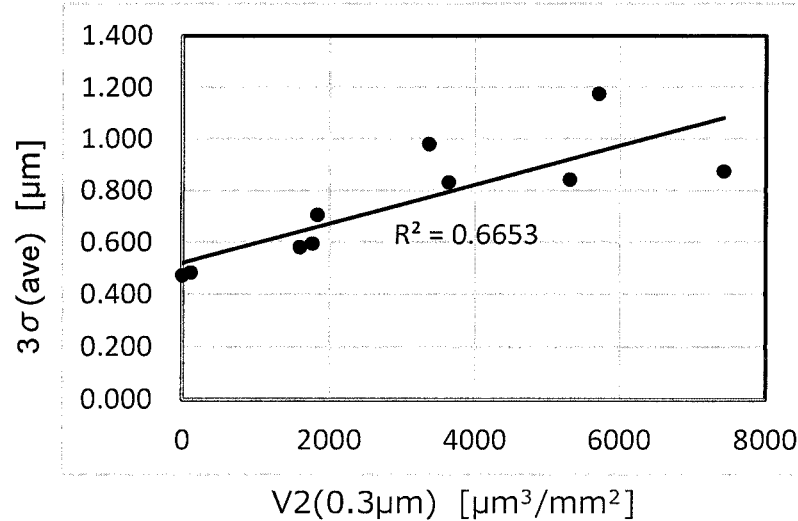
FIG. 36 is a scatter diagram showing the correlation between the indices obtained by the third inspection example and the size precision of rib portions formed in each sample.

Further, the correlation coefficient $R^2$ between the corrected pit volume density V2 (0.3 μm) and 3σ (ave) from the width of the rib portion 82, which were calculated for each sample, was determined. The resulting correlation coefficient $R^2$ was 0.6653. FIG. 36 is a scatter diagram showing the correlation between the corrected pit volume density V2 (0.3 μm) and 3σ (ave) from the width of the rib portion 82.

Figure 37:
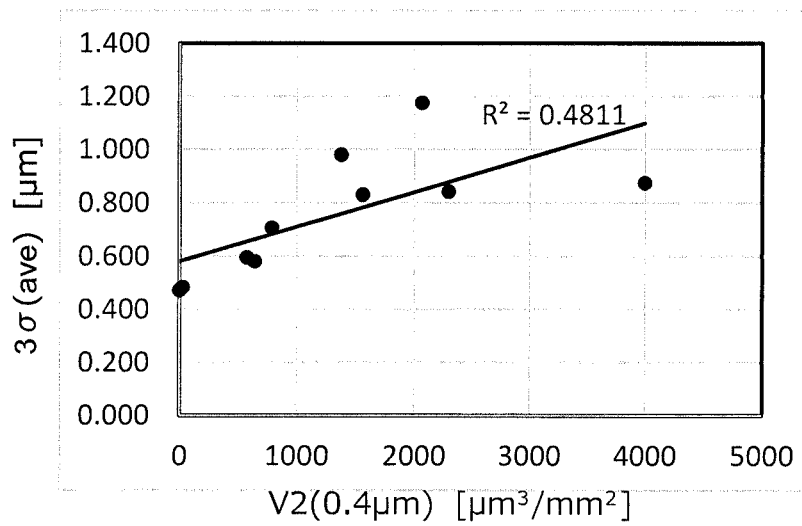
FIG. 37 is a scatter diagram showing the correlation between the indices obtained by the fourth inspection example and the size precision of rib portions formed in each sample.

Further, the correlation coefficient $R^2$ between the corrected pit volume density V2 (0.4 μm) and 3σ (ave) from the width of the rib portion 82, which were calculated for each sample, was determined. The resulting correlation coefficient $R^2$ was 0.4811. FIG. 37 is a scatter diagram showing the correlation between the corrected pit volume density V2 (0.4 μm) and 3σ (ave) from the width of the rib portion 82.

Figure 38:
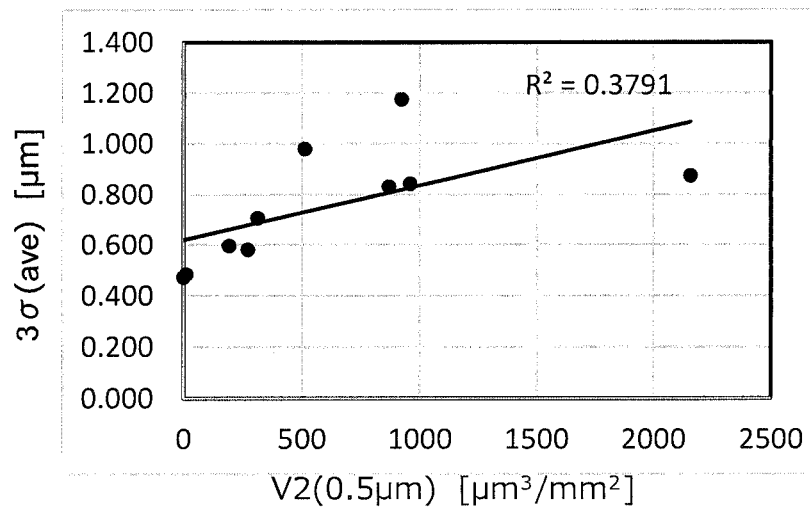
FIG. 38 is a scatter diagram showing the correlation between the indices obtained by the fifth inspection example and the size precision of rib portions formed in each sample.

Further, the correlation coefficient $R^2$ between the corrected pit volume density V2 (0.5 μm) and 3σ (ave) from the width of the rib portion 82, which were calculated for each sample, was determined. The resulting correlation coefficient $R^2$ was 0.3791. FIG. 38 is a scatter diagram showing the correlation between the corrected pit volume density V2 (0.5 μm) and 3σ (ave) from the width of the rib portion 82.

According to the first inspection example, inspection of the irregularities in the surface of the metal plate based on the volumes of pits successfully gave an index highly correlated with the size precision of the rib portion 82 formed by etching.

As can be seen from the comparison between the first inspection example and the second to fifth inspection examples described above, according to the first inspection example where the correction distance dC between the reference plane RP and the correction plane CP was set as 0.2 µm, an index highly correlated with the size precision of the rib portion 82 formed by etching was successfully obtained.

It is considered that, in the second inspection example where the correction distance dC was set as 0.1 µm, the correction distance dC was so small that not only specific pits having a great effect on the size precision of the rib portion 82, but also pits having little effect on the size precision of the rib portion 82 were detected, so that the correlation coefficient was lowered. It is considered that, in the third to fifth inspection examples where the correction distance dC was set as 0.3 µm or more, the correction distance dC was so large that the differences in the density and the size of pits were not reflected in the corrected pit volume density V2 when a relatively smooth metal plate having a small density of pits was evaluated, so that the correlation coefficient was lowered.

The invention claimed is:

1. A metal plate for use in manufacturing of a deposition mask, the metal plate including pits located on a surface of the metal plate;

wherein the surface includes an inspection area having an area of 0.1 mm$^2$ or more and some of the pits are located in the inspection area;

wherein the metal plate has a corrected pit volume density of 15,000 µm$^3$/mm$^2$ or less, the corrected pit volume density being calculated by dividing a corrected pit volume by the area of the inspection area;

wherein the corrected pit volume is a sum of volumes of parts of the pits located in the inspection area, said parts of the pits being 0.2 µm or more away from the surface in the thickness direction of the metal plate;

wherein the volumes of said part of the pits are calculated based on results for depths of the pits located in the inspection area, the depths being measured with a laser microscope.

2. The metal plate according to claim 1, wherein the corrected pit volume density is 10 µm$^3$/mm$^2$ or more.

3. The metal plate according to claim 1, wherein the metal plate is composed of an iron alloy containing nickel.

4. A deposition mask, comprising a metal plate including pits located on a surface; and through-holes formed in the metal plate, wherein the surface includes an inspection area having an area of 0.1 mm$^2$ or more and some of the pits are located in the inspection area;

wherein the metal plate has a corrected pit volume density of 15,000 µm$^3$/mm$^2$ or less, the corrected pit volume density being calculated by dividing a corrected pit volume by the area of the inspection area;

wherein the corrected pit volume is a sum of volumes of parts of the pits located in the inspection area, said parts of the pits being 0.2 µm or more away from the surface in the thickness direction of the metal plate;

wherein the volumes of said parts of the pits are calculated based on results for depths of the pits located in the inspection area, the depths being measured with a laser microscope.

5. The deposition mask according to claim 4, wherein the corrected pit volume density is 10 µm$^3$/mm$^2$ or more.

* * * * *